(12) United States Patent
Fuji et al.

(10) Patent No.: US 12,431,399 B2
(45) Date of Patent: Sep. 30, 2025

(54) SEMICONDUCTOR DEVICE AND METHOD FOR MANUFACTURING SEMICONDUCTOR DEVICE

(71) Applicant: ROHM CO., LTD., Kyoto (JP)

(72) Inventors: Kazunori Fuji, Kyoto (JP); Xiaopeng Wu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 482 days.

(21) Appl. No.: 17/925,719

(22) PCT Filed: May 21, 2021

(86) PCT No.: PCT/JP2021/019392
§ 371 (c)(1),
(2) Date: Nov. 16, 2022

(87) PCT Pub. No.: WO2021/241447
PCT Pub. Date: Dec. 2, 2021

(65) Prior Publication Data
US 2023/0197544 A1 Jun. 22, 2023

(30) Foreign Application Priority Data
May 26, 2020 (JP) .................................. 2020-091169

(51) Int. Cl.
*H01L 23/00* (2006.01)
*H01L 23/29* (2006.01)
(52) U.S. Cl.
CPC ............ *H01L 23/293* (2013.01); *H01L 24/05* (2013.01); *H01L 24/16* (2013.01); *H01L 24/48* (2013.01);
(Continued)

(58) Field of Classification Search
CPC ....... H01L 23/293; H01L 24/05; H01L 24/16; H01L 24/48; H01L 24/73;
(Continued)

(56) References Cited

FOREIGN PATENT DOCUMENTS

DE     601 28 656 T2    10/2007
JP     2001-291721 A    10/2001
(Continued)

OTHER PUBLICATIONS

International Search Report issued in PCT/JP2021/019392, Aug. 3, 2021 (2 pages).

(Continued)

*Primary Examiner* — Elias Ullah
(74) *Attorney, Agent, or Firm* — HSML P.C.

(57) ABSTRACT

A semiconductor device includes an insulating layer, a semiconductor element, a wiring layer and a sealing resin. The insulating layer includes obverse and reverse surfaces spaced apart in a thickness direction, and a penetrated part extending in the thickness direction. The semiconductor element, in contact with the obverse surface, includes an electrode corresponding to the penetrated part. The wiring layer includes connecting and main parts, where the connecting part is in the penetrated part and contacts the electrode, and the main part is connected to the connecting part on the reverse surface. The sealing resin, contacting the obverse surface, covers the semiconductor element. The electrode has a connecting surface facing the connecting part and including a first region exposed from the insulating layer through the penetrated part and a second region contacting the insulating layer. The first region has a greater surface roughness than the second region.

18 Claims, 21 Drawing Sheets

(52) U.S. Cl.
CPC .... *H01L 24/73* (2013.01); *H01L 2224/04042* (2013.01); *H01L 2224/16225* (2013.01); *H01L 2224/48151* (2013.01); *H01L 2224/73265* (2013.01); *H01L 2924/186* (2013.01)

(58) Field of Classification Search
CPC . H01L 2224/04042; H01L 2224/16225; H01L 2224/48151; H01L 2224/73265; H01L 2924/186; H01L 23/49816; H01L 23/3128; H01L 23/49822
See application file for complete search history.

(56) References Cited

FOREIGN PATENT DOCUMENTS

| | | |
|---|---|---|
| JP | 2001-308478 A | 11/2001 |
| JP | 2016-89081 A | 5/2016 |
| WO | 2018/047770 A1 | 3/2018 |

OTHER PUBLICATIONS

Office Action issued in corresponding Japanese Patent application No. 2022-526992, Jan. 21, 2025 and machine translation ( pages).
Office Action issued in corresponding German Patent application No. 11 2021 002 956.8, Aug. 18, 2025, and machine translation (7 pages).

SEMICONDUCTOR DEVICE AND METHOD FOR MANUFACTURING SEMICONDUCTOR DEVICE

TECHNICAL FIELD

The present disclosure relates to a semiconductor device and a method for manufacturing the semiconductor device.

BACKGROUND ART

With the recent trend toward more compact electronic devices, semiconductor devices for use in such electronic devices have been engineered to be more compact. To meet the trend, a known semiconductor device includes a sealing resin, an insulating layer stacked on the sealing resin, a semiconductor element having an electrode and covered with the sealing resin and the insulating layer with the electrode exposed from the sealing resin, and a wiring layer connected to the electrode and disposed on the insulating layer. The semiconductor device of this configuration can be configured compact. In addition, this configuration provides greater flexibility in the placement of a wiring layer, enabling the semiconductor device to have a wiring layer matching the wiring pattern of a wiring board targeted for mounting.

A method for manufacturing such a semiconductor device is disclosed in Patent document 1. The method includes a step of embedding a semiconductor element having an electrode in a sealing resin (a hardened body in Patent document 1), a step of forming an insulating layer (a buffer coat film in Patent document 1) in contact with the semiconductor element and the sealing resin, and a step of forming a wiring layer connected to the electrode. In the embedding step, the semiconductor element is embedded in the sealing resin with the electrode exposed from the sealing resin. In the step of forming the insulating layer, an opening is formed in the insulating layer by photolithographic patterning. The opening is formed to expose the electrode. In the step of forming the wiring layer, a plating layer is formed such that the plating layer is connected to the electrode and a portion of the plating layer is contained in the opening. The plating layer is a component forming a portion of the wiring layer.

In the step of forming the wiring layer, voids may form between the electrode of the semiconductor element and the wiring layer connected to the electrode. Voids formed to a relatively large extent may inhibit the conduction between the semiconductor element and the wiring layer. It is therefore desirable to reduce or prevent the formation of voids by improving the adhesion of the wiring layer to the electrode.

PRIOR ART DOCUMENTS

Patent Document

Patent Document 1: JP-A-2016-89081

SUMMARY OF THE INVENTION

Problem to be Solved by the Invention

In view of the circumstances described above, the present disclosure may aim to provide a semiconductor device and a method for manufacturing the semiconductor device for improving adhesion of the wiring layer to the electrode of the semiconductor element.

Means to Solve the Problem

A first aspect of the present disclosure provides a semiconductor device. The semiconductor device includes: a first insulating layer including a first obverse surface and a first reverse surface spaced apart from each other in a thickness direction, the first insulating layer being formed with a first penetrated part extending in the thickness direction; a semiconductor element that includes an electrode corresponding to the first penetrated part and is in contact with the first obverse surface; a first wiring layer including a first connecting part and a first main part, the first connecting part being contained in the first penetrated part and in contact with the electrode, the first main part being connected to the first connecting part and disposed on the first reverse surface; and a sealing resin in contact with the first obverse surface and covering the semiconductor element. The electrode has a connecting surface facing the first connecting part, and the connecting surface includes a first region that is exposed from the first insulating layer through the first penetrated part and a second region that is in contact with the first insulating layer. The first region has a greater surface roughness than the second region.

Preferably, the first wiring layer includes a first base layer in contact with the first insulating layer and a first plating layer covering the first base layer, and the first plating layer is in contact with the first region.

Preferably, the first insulating layer is made of a material containing a thermosetting synthetic resin and an additive that contains a metallic element forming the first base layer.

Preferably, the first insulating layer includes a groove recessed from the first reverse surface and connected to the first penetrated part, and the first main part is disposed in the groove.

Preferably, the first main part includes a recess that is recessed in the thickness direction, and the recess extends in a direction in which the groove extends.

Preferably, the first insulating layer includes a first inner peripheral surface that defines the first penetrated part, and the first inner peripheral surface is covered with the first base layer and inclined relative to the first obverse surface.

Preferably, the first penetrated part has a first cross section perpendicular to the thickness direction, and an area of the first cross section increases from the first obverse surface toward the first reverse surface.

Preferably, the semiconductor device further includes a protective layer that covers the first reverse surface and the first main part. The protective layer may have an opening that penetrates in the thickness direction, and a portion of the first main part may be exposed from the protective layer through the opening.

Preferably, the semiconductor device further includes a terminal, and the terminal is bonded to the portion of the first main part exposed from the protective layer through the opening. The terminal may protrude from the protective layer in the thickness direction.

Preferably, the terminal is made of a material containing tin.

Preferably, the semiconductor device further includes: a second insulating layer including a second obverse surface and a second reverse surface spaced apart from each other in the thickness direction, the second insulating layer being formed with a second penetrated part extending in the thickness direction, the second obverse surface being in contact with the first reverse surface; and a second wiring layer including a second connecting part and a second main part, the second connecting part being contained in the second penetrated part and connected to the first main part, the second main part being connected to the second connecting part and disposed on the second reverse surface. The first main part may be covered with the second insulating layer. At least a portion of the second penetrated part may overlap with the first main part as viewed in the thickness direction.

Preferably, the second main part includes a portion overlapping with the first main part as viewed in the thickness direction and extends in a direction different from a direction in which the first main part extends.

Preferably, the second wiring layer includes a second base layer in contact with the second insulating layer and a second plating layer covering the second base layer. The second plating layer may be in contact with the first main part in the second connecting part.

Preferably, the second insulating layer is made of a material containing a thermosetting synthetic resin and an additive that contains a metallic element forming the second base layer.

Preferably, the second insulating layer includes a second inner peripheral surface that defines the second penetrated part, and the second inner peripheral surface is covered with the second base layer and inclined relative to the second obverse surface.

Preferably, the second penetrated part has a second cross section perpendicular to the thickness direction, and an area of the second cross section increases from the second obverse surface toward the second reverse surface.

A second aspect of the present disclosure provides a method for manufacturing a semiconductor device. The method includes: embedding a semiconductor element having an electrode in a sealing resin such that the electrode is exposed; forming an insulating layer on the sealing resin to cover the electrode; and forming a wiring layer including a connecting part that is embedded in the insulating layer and connected to the electrode and a main part that is connected to the connecting part. The insulating layer is made of a material containing a thermosetting synthetic resin and an additive that contains a metallic element for forming a portion of the wiring layer. The forming the wiring layer includes: (a) forming, in the insulating layer by laser irradiation, a penetrated part to expose a portion of a surface of the electrode from the insulating layer and a groove recessed from the surface of the insulating layer and connected to the penetrated part; (b) depositing a base layer containing the metallic element to cover an inner peripheral surface defining the penetrated part of the insulating layer and the groove; and (c) forming a plating layer covering the base layer. The depositing the base layer includes forming, by the laser irradiation, asperities on the portion of the surface of the electrode exposed from the insulating layer through the penetrated part.

Preferably, the forming the plating layer includes forming the plating layer by at least one of electroless plating or electrolytic plating.

Advantages of Invention

The semiconductor device and its manufacturing method according to the present disclosure can improve the adhesion of the wiring layer to the electrode of the semiconductor device.

Other features and advantages of the present disclosure will become apparent from the detailed description given below with reference to the accompanying drawings.

MODE FOR CARRYING OUT THE INVENTION

Embodiments of the present disclosure are described below with reference to the accompanying drawings.

Figure 1:
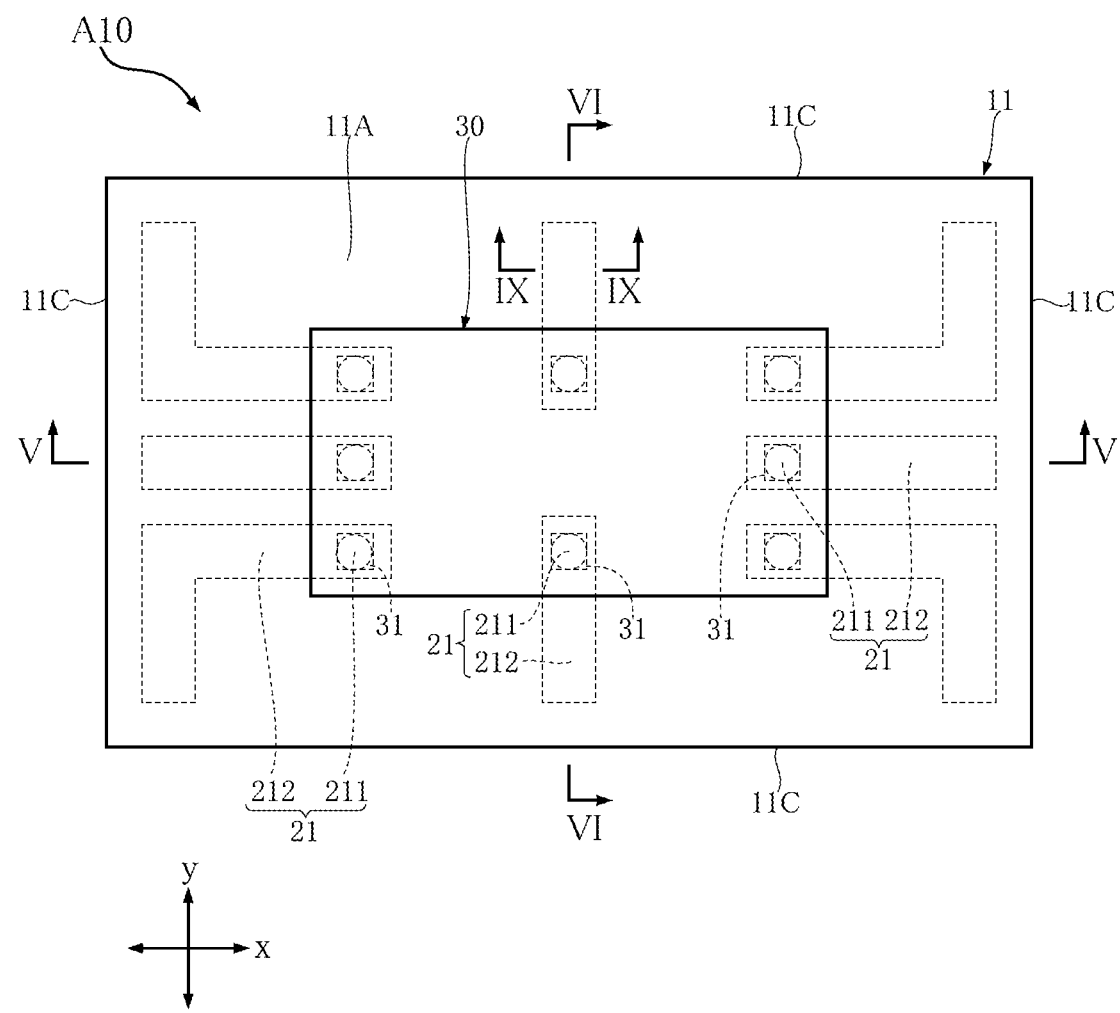
FIG. 1 is a plan view of a semiconductor device according to a first embodiment, as seen through a sealing resin.
Figure 2:
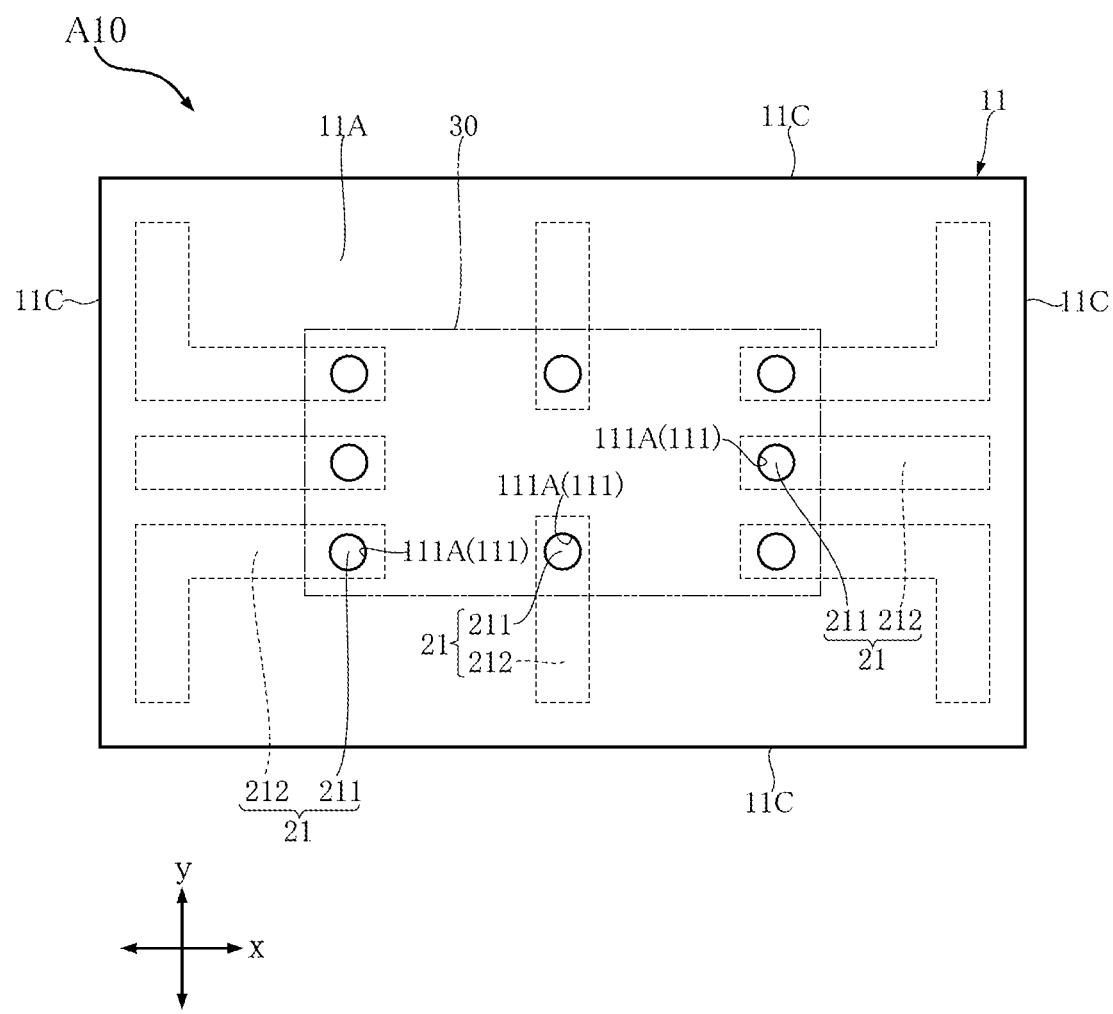
FIG. 2 is a plan view corresponding to FIG. 1, as seen further through a semiconductor element.
Figure 3:
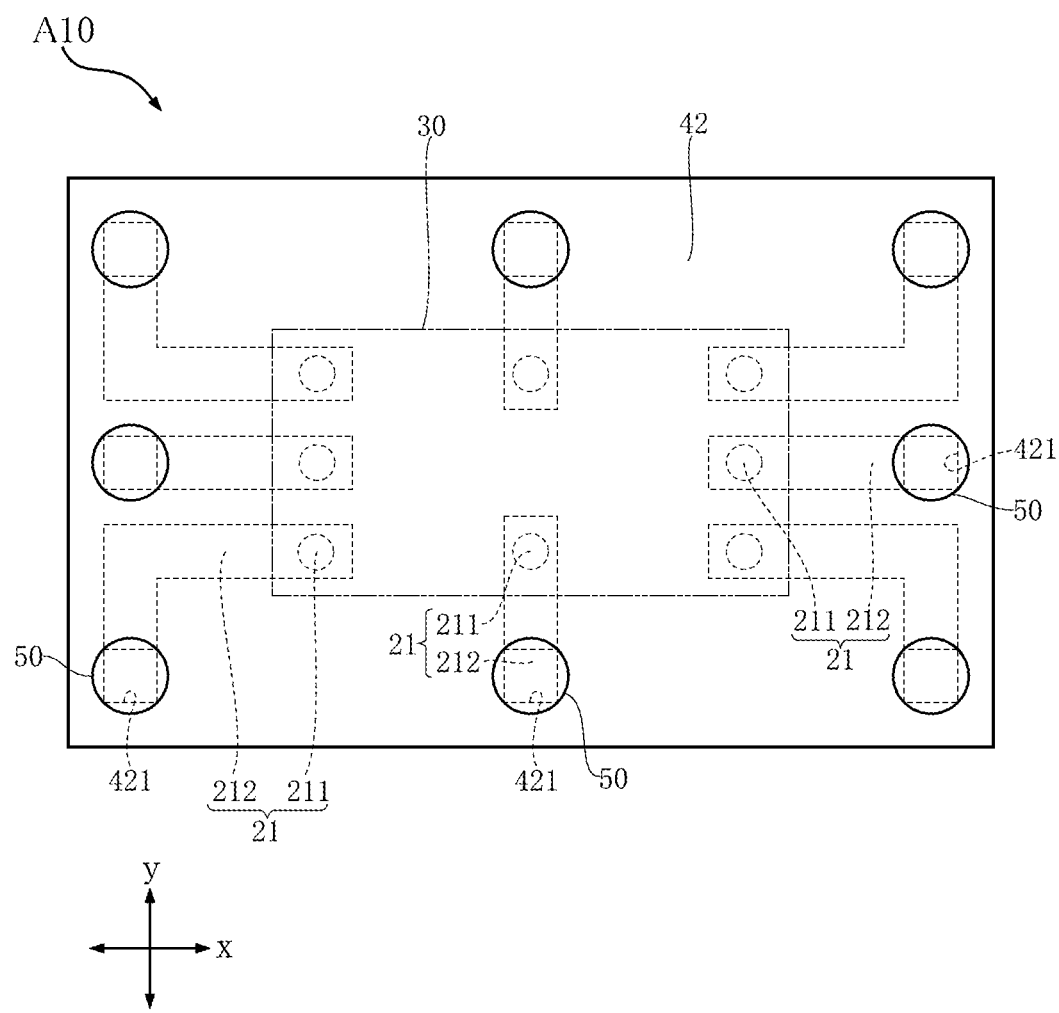
FIG. 3 is a bottom view of the semiconductor device shown in FIG. 1.
Figure 4:
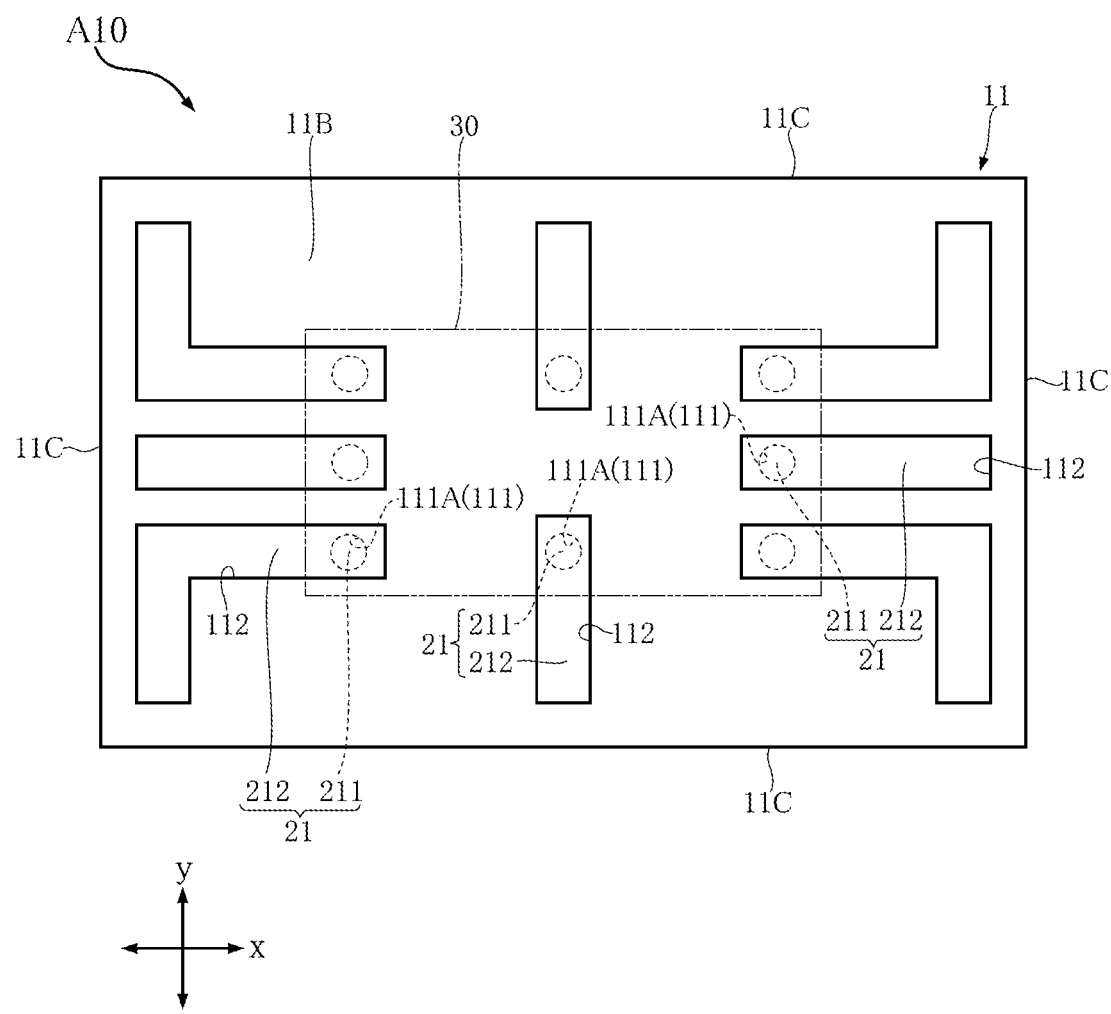
FIG. 4 is a bottom view corresponding to FIG. 3, as seen through a protective layer and a plurality of terminals.

With reference to FIGS. 1 to 10, a semiconductor device A10 according to a first embodiment is described. The semiconductor device A10 includes a first insulating layer 11, a plurality of first wiring layers 21, a semiconductor element 30, a sealing resin 41, a protective layer 42 and a plurality of terminals 50. The semiconductor device A10 is surface-mounted on a wiring board. The semiconductor device A10 includes one semiconductor element 30. Alternatively, the semiconductor device A10 may include a plurality of semiconductor elements 30. For example, the plurality of semiconductor elements 30 include a laser diode and a switching element such as MOSFET. With this configuration, the switching element is operated to cause the laser diode to emit pulses of light at intervals of a few nanoseconds. The semiconductor device A10 of this configuration can operate like a radar to detect a relatively distant object. This detection technique is called LIDAR (Laser Imaging Detection and Ranging). For convenience, FIG. 1 shows the sealing resin 41 as transparent, and FIG. 2 shows the semiconductor element 30 also as transparent. FIG. 4 shows the protective layer 42 and the plurality of terminals 50 as transparent. FIG. 2 shows the outline of the semiconductor element 30 in phantom lines (double-dashed lines).

Figure 5:
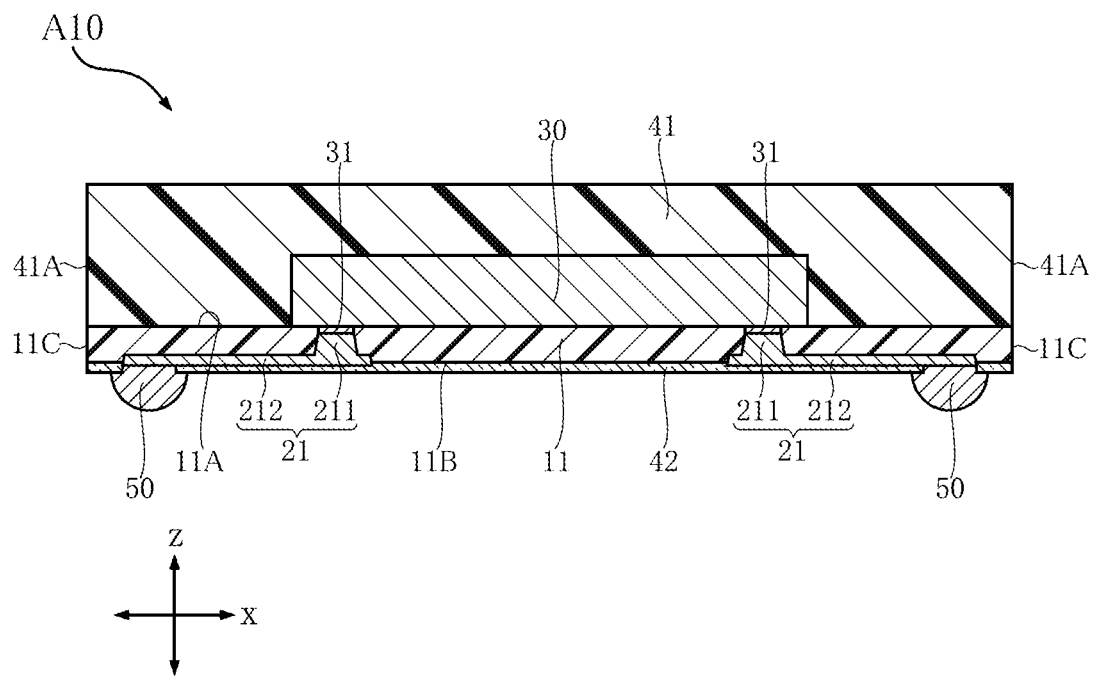
FIG. 5 is a sectional view taken along line V-V of FIG. 1.

For convenience, the semiconductor device A10 is described with reference to three mutually perpendicular directions as appropriate. In the illustrated examples, the three directions are a first direction x, a second direction y and a thickness direction z, but the present disclosure is not limited to this. In FIG. 5, for example, the thickness direction z corresponds to a direction passing through the thickness of, for example, the first insulating layer 11. As shown in FIG. 1, the semiconductor device A10 has a rectangular outer shape as viewed in the thickness direction z. The first direction x is parallel to one side (a first side) of the semiconductor device A10, and the second direction y is parallel to another side (a second side perpendicular to the first side) of the semiconductor device A10. In the illustrated example, the first side is longer than the second side, but the present disclosure is not limited to this.

Figure 6:
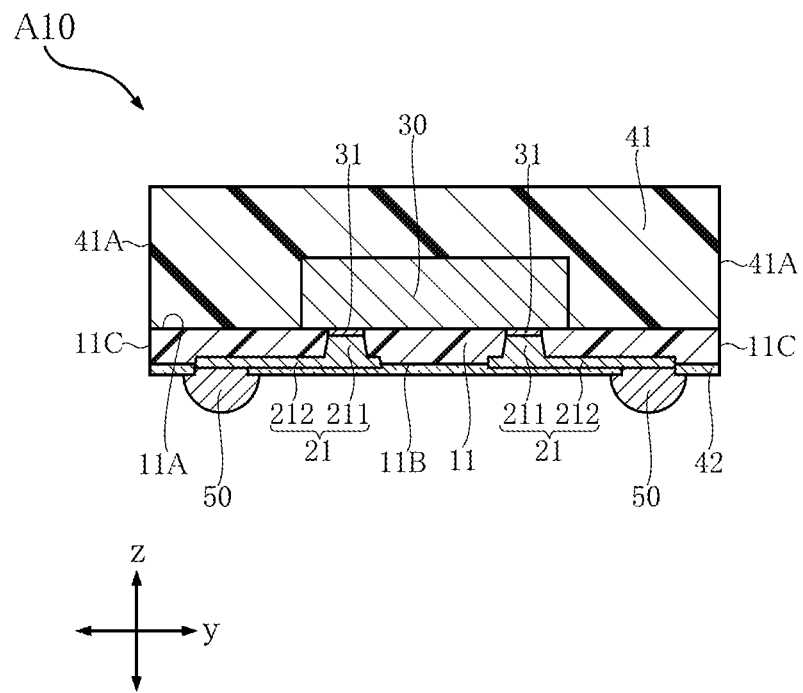
FIG. 6 is a sectional view taken along line VI-VI of FIG. 1.

As shown in FIGS. 5 and 6, the first insulating layer 11 faces the semiconductor element 30 in the thickness direction z. The first insulating layer 11 is made of a material containing a thermosetting synthetic resin and an additive that contains a metallic element forming a portion (a first base layers 21A described below) of each first wiring layer 21. The synthetic resin may be an epoxy resin or polyimide, for example. The first insulating layer 11 has a first obverse surface 11A, a first reverse surface 11B and a plurality of end surfaces 11C. The first obverse surface 11A and the first reverse surface 11B face away from each other in the thickness direction z. The first obverse surface 11A faces the semiconductor element 30. The end surfaces 11C are connected to the first obverse surface 11A and the first reverse surface 11B. Each end surface 11C faces either in the first direction x or the second direction y.

Figure 7:
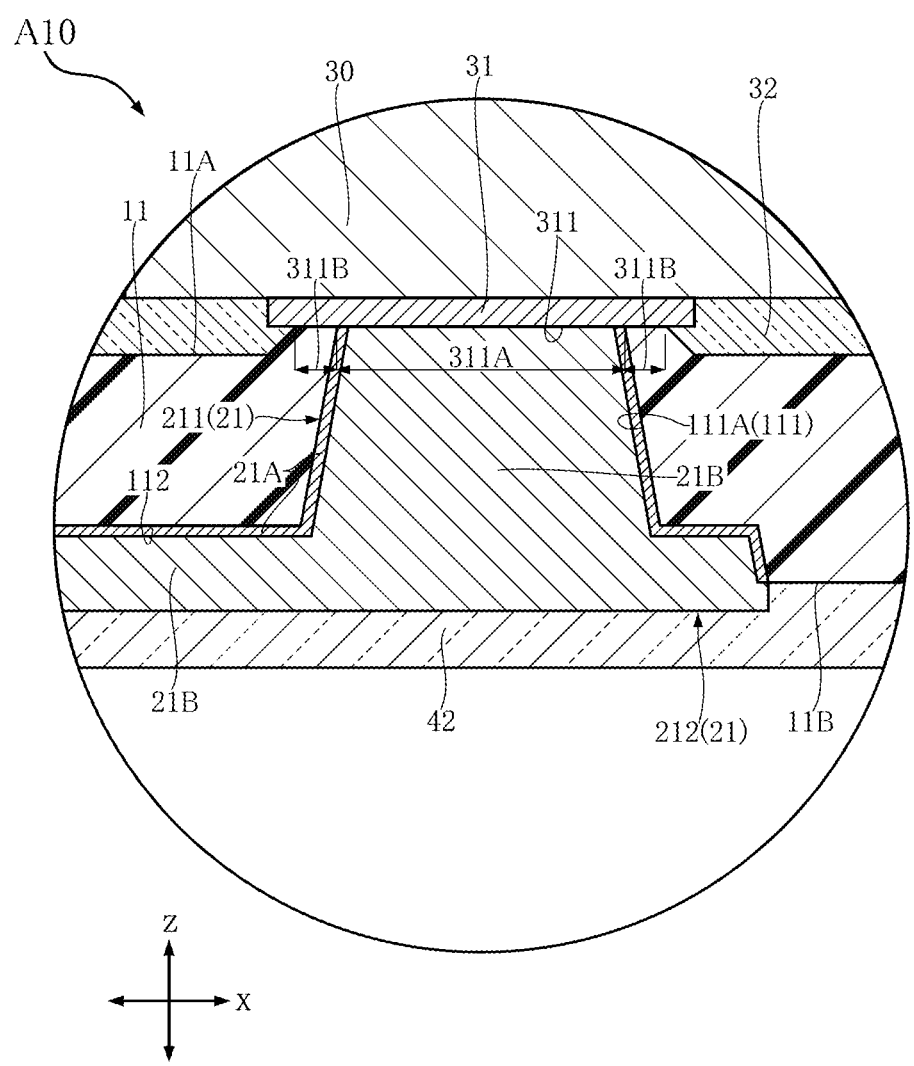
FIG. 7 is an enlarged fragmentary view of FIG. 5.

As shown in FIGS. 2, 4 and 7, the first insulating layer 11 has a plurality of first penetrated parts 111. Each first penetrated part 111 extends in the thickness direction z from the first obverse surface 11A to the first reverse surface 11B, penetrating the first insulating layer 11 in the thickness direction z. Each first penetrated part 111 is defined by a first inner peripheral surface 111A of the first insulating layer 11. Each first inner peripheral surface 111A is inclined relative to the first obverse surface 11A. Each first inner peripheral surface 111A is inclined inwardly of the relevant first penetrated part 111 as proceeding from a position closer to the first reverse surface 11B to a position closer to the first obverse surface 11A. Accordingly, each first penetrated part 111 has a cross-sectional area transverse to the thickness direction z that gradually increases as proceeding reversely, i.e., from the position closer to the first obverse surface 11A toward the position closer to the first reverse surface 11B.

Figure 8:
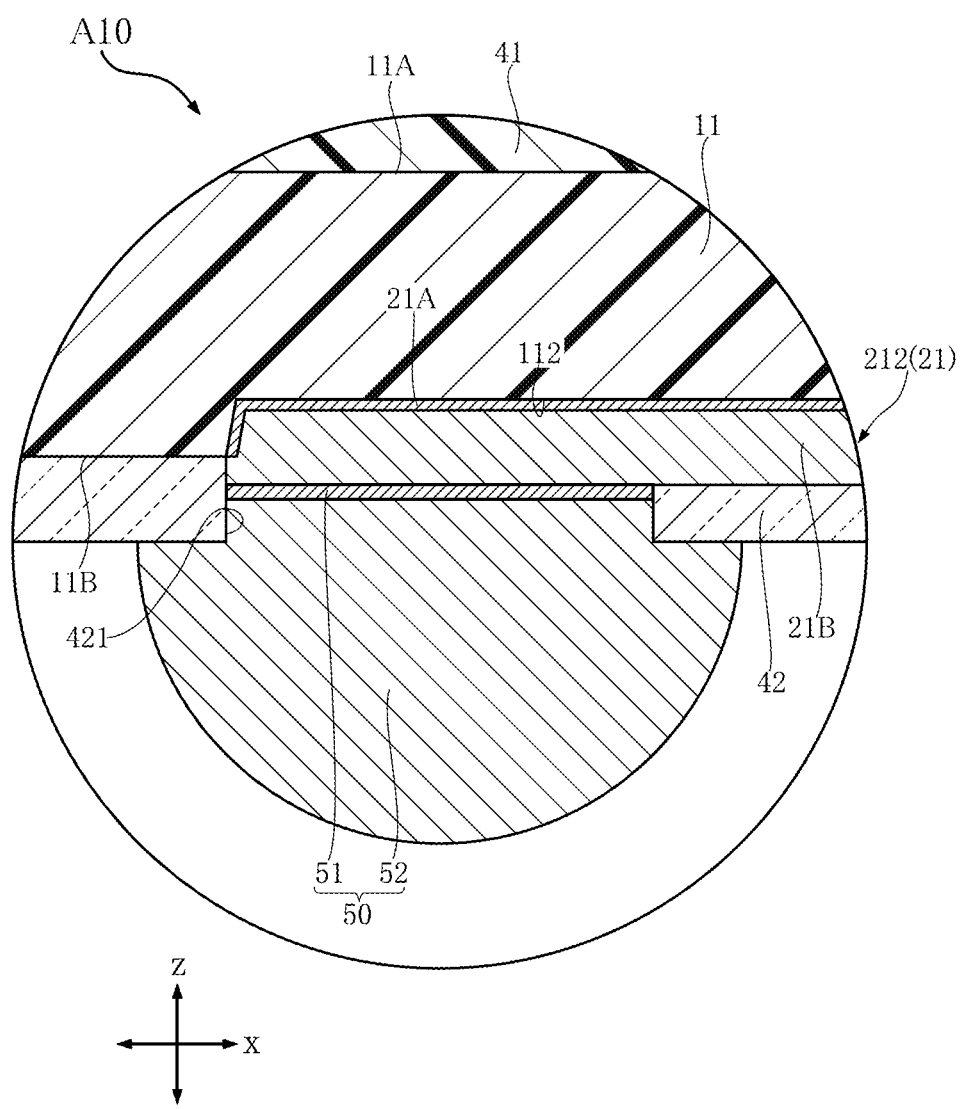
FIG. 8 is an enlarged fragmentary view of FIG. 5.
Figure 9:
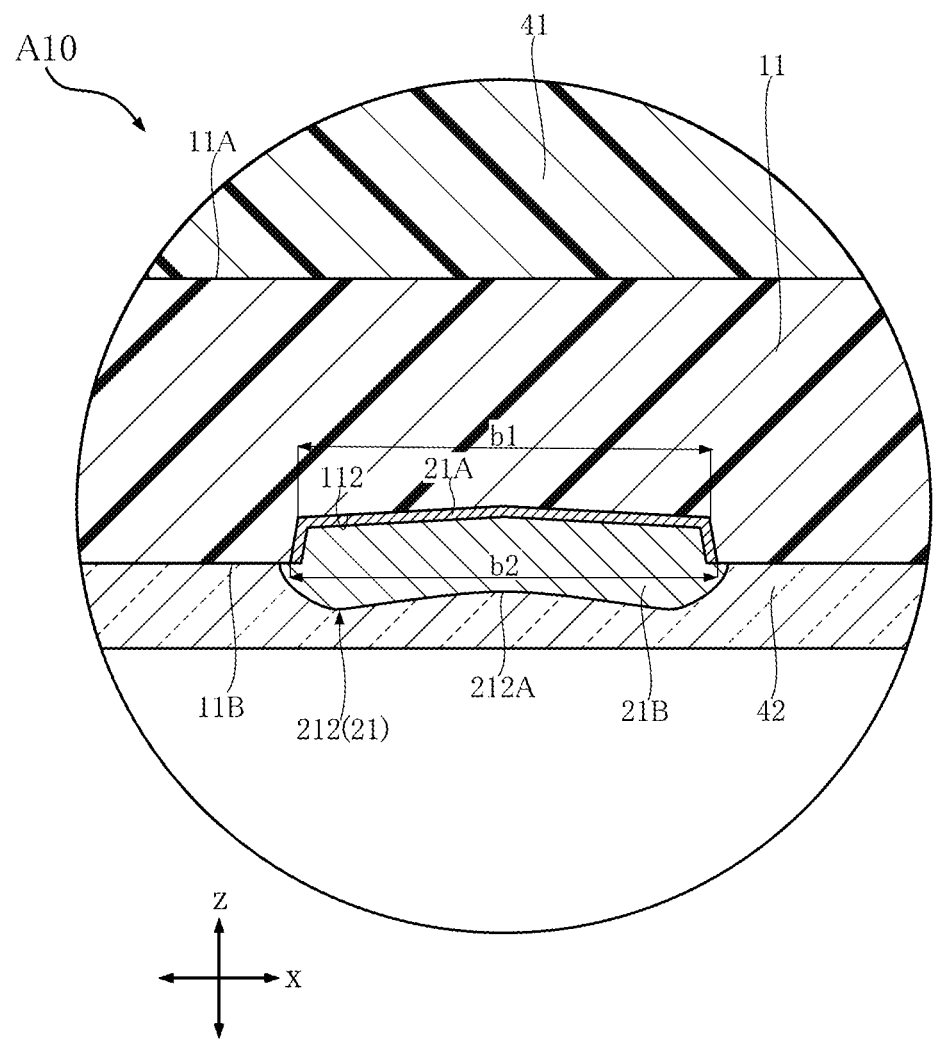
FIG. 9 is an enlarged fragmentary sectional view taken along line IX-IX of FIG. 1.

As shown in FIGS. 7 to 9, the first insulating layer 11 includes a plurality of first grooves 112. The first grooves 112 are recessed in the thickness direction z from the first reverse surface 11B. Each first groove 112 is connected to one of the first penetrated parts 111. As shown in FIG. 4, each first groove 112 extends in a direction perpendicular to the thickness direction z. As shown in FIG. 9, each first groove 112 has a pair of side surfaces inclined relative to the first reverse surface 11B. Each first groove 112 has a width b1 that is measured between the pair of side surfaces at the boundary with the bottom of the first groove 112 and another width b2 that is measured between the pair of side surfaces at the boundary with the first reverse surface 11B, where the width b1 is smaller than the width b2.

As shown in FIGS. 5 and 6, the first wiring layers 21 are disposed on the first insulating layer 11. The first wiring layers 21 will form a part of a conduction path between a wiring board and the semiconductor element 30 when the semiconductor device A10 is mounted on the wiring board. Each first wiring layer 21 includes a first connecting part 211 and a first main part 212. As shown in FIGS. 2, 4 and 7, the first connecting part 211 is arranged in one of the first penetrated parts 111 of the first insulating layer 11. The first connecting part 211 is in contact with the first inner peripheral surface 111A of the first penetrated part ill. The first connecting part 211 is connected to one of a plurality of electrodes (detailed later) of the semiconductor element 30. As shown in FIGS. 4 to 6, the first main part 212 of each first wiring layer 21 is connected to the first connecting part 211 of the first wiring layer 21 and is located on the side closer to the first reverse surface 11B of the first insulating layer 11. More specifically, the first main part 212 is located in one of the first grooves 112 of the first insulating layer 11. The first main part 212 is in contact with a relevant first groove 112. As shown in FIGS. 7 to 9, in the semiconductor device A10, the first main part 212 of each first wiring layer 21 has a portion bulging out of a relevant first groove 112.

As shown in FIGS. 7 to 9, the first connecting part 211 and the first main part 212 of each first wiring layer 21 includes a first base layer 21A and a first plating layer 21B. The first base layer 21A is formed from the metallic element that is contained in the additive used in the first insulating layer 11. The first base layer 21A is in contact with the first insulating layer 11. The first base layer 21A that forms the first connecting part 211 of each first wiring layer 21 covers one of the first inner peripheral surfaces 111A of the first insulating layer 11. The first plating layer 21B covers the first base layer 21A of the first wiring layer 21. The first plating layer 21B is made of a material containing tin. As shown in FIG. 9, each first wiring layer 21 has a recess 212A that is recessed in the thickness direction z in the first plating layer 21B forming the first main part 212. The recess 212A extends in the direction in which a relevant first groove 112 of the first insulating layer 11 extends.

As shown in FIGS. 5 and 6, the semiconductor element 30 is disposed in contact with the first obverse surface 11A of the first insulating layer 11. In the semiconductor device A10, the semiconductor element 30 is flip-chip mounted. The semiconductor element 30 includes a plurality of electrodes 31. The electrodes 31 are located on one side of the semiconductor element 30 in the thickness direction z. The electrodes 31 are located on the side closer to the first obverse surface 11A in the thickness direction z. The electrodes 31 are electrically connected to a circuit formed in the semiconductor element 30. Each electrode 31 may be composed of a single metal layer or a plurality of metal layers stacked in the thickness direction z. As shown in FIG. 7, each electrode 31 has a connecting surface 311. The connecting surface 311 faces in the thickness direction z toward the same side as the first reverse surface 11B of the first insulating layer 11. The first connecting part 211 of each first wiring layer 21 is connected to the connecting surface 311 of one of the electrodes 31. This electrically connects the first wiring layers 21 to the semiconductor element 30. As shown in FIG. 7, the semiconductor element 30 includes a passivation film 32. The passivation film 32 is where the semiconductor element 30 is in contact with the first obverse surface 11A. The passivation film 32 is in contact with all of the electrodes 31. The passivation film 32 may be made of a material containing polyimide, for example.

Figure 10:
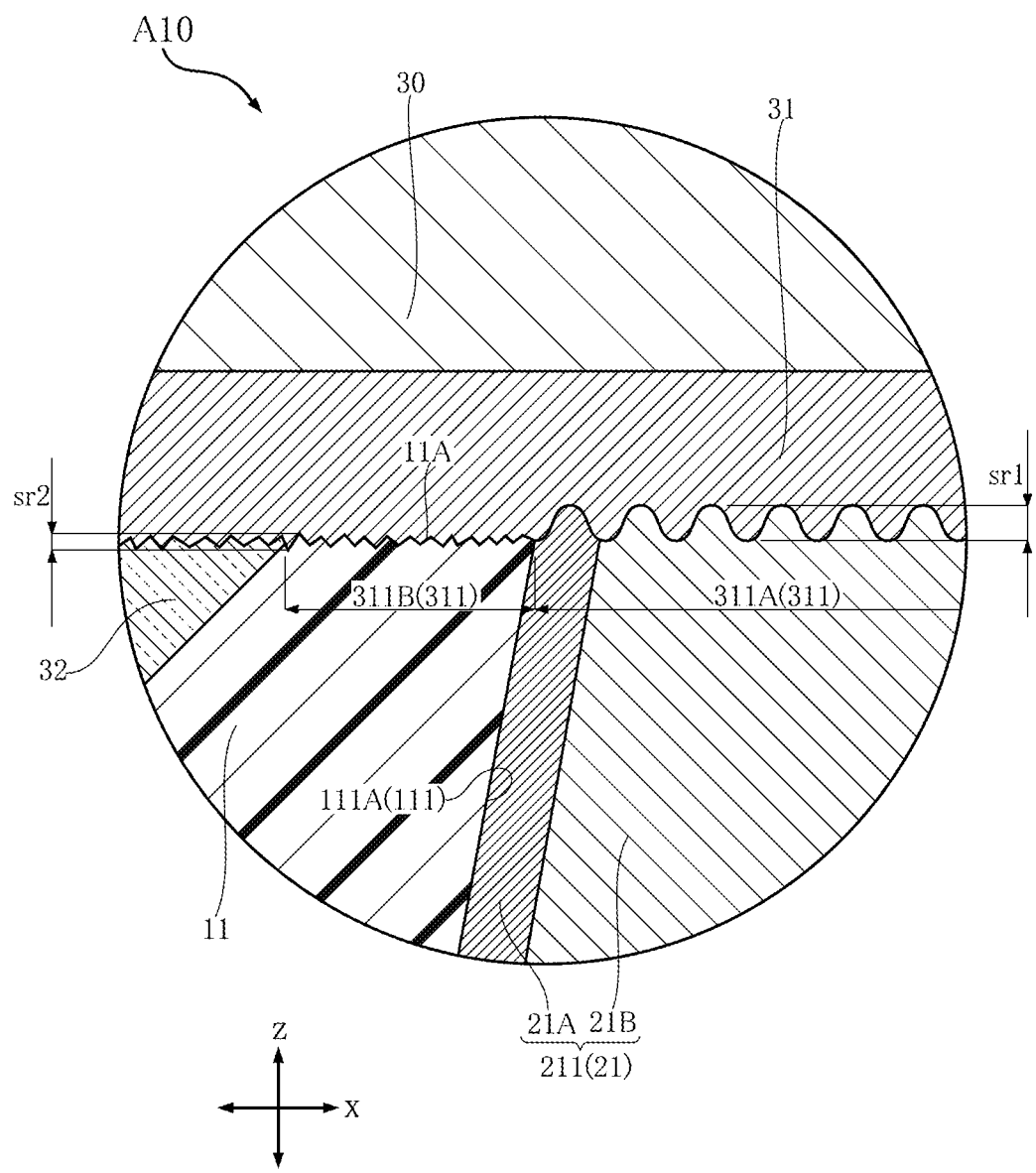
FIG. 10 is an enlarged fragmentary view of FIG. 7.

As shown in FIG. 7, the connecting surface 311 of each electrode 31 includes a first region 311A and a second region 311B. The first region 311A is exposed from the first insulating layer 11 through a relevant first penetrated part 111 of the first insulating layer 11. The first region 311A of each electrode 31 is in contact with the first plating layer 21B of the first connecting part 211 of a relevant first wiring layer 21. The second region 311B is covered with the first insulating layer 11. As shown in FIG. 10, in the connecting surface 311 of each electrode 31, the surface roughness sr1 of the first region 311A is greater than the surface roughness sr2 of the second region 311B. The surface roughness sr1 and sr2 is the distance measured in the thickness direction z within the connecting surface 311 between the lowest or innermost point in the electrode 31 in the thickness direction z and the highest or farthest point from the lowest point in the thickness direction z.

As shown in FIGS. 5 and 6, the sealing resin 41 is disposed in contact with the first obverse surface 11A of the first insulating layer 11 and covers a portion of the semiconductor element 30. The sealing resin 41 may be made of a material containing a black epoxy resin, for example. The sealing resin 41 has a plurality of side surfaces 41A. Each side surface 41A faces either in the first direction x or the second direction y. Each side surface 41A is flush with one of the end surfaces 11C of the first insulating layer 11.

As shown in FIGS. 5 and 6, the protective layer 42 covers the first reverse surface 11B of the first insulating layer 11 and the first main parts 212 of the first wiring layers 21. When the semiconductor device A10 is mounted on a wiring board, the protective layer 42 faces the wiring board. The protective layer 42 is electrically insulating. The protective layer 42 may be made of a material containing polyimide, for example. As shown in FIGS. 3 and 8, the protective layer 42 has a plurality of openings 421. Each opening 421 penetrates the protective layer 42 in the thickness direction z. The first main part 212 of each first wiring layer 21 has a portion exposed from the protective layer 42 through a relevant opening 421.

As shown in FIGS. 3 and 8, the terminals 50 are bonded to the first wiring layers 21 at the portions of the first main parts 212 exposed from the protective layer 42 through the openings 421. The terminals 50 are used for mounting the semiconductor device A10 to a wiring board. Each terminal 50 protrudes from the protective layer 42 in the thickness direction z. As shown in FIG. 8, in the example of the semiconductor device A10, each terminal 50 includes a base 51 and a bump 52. The base 51 is in contact with the first main part 212 of a relevant first wiring layer 21. The base 51 is composed of a plurality of metal layers, which are a nickel (Ni) layer, a palladium (Pd) layer and a gold (Au) layer stacked in the stated order from the first reverse surface 11B of the first insulating layer 11 in the thickness direction z. Of these metal layers, a palladium layer can be omitted. The bump 52 is in contact with both of the base 51 and the protective layer 42. A portion of the bump 52 protrudes from the protective layer 42 in the thickness direction z. The bump 52 is made of a material containing tin (Sn). In one example, the bump 52 is made of lead-free solder.

With reference to FIGS. 11 to 20, an example of a method for manufacturing the semiconductor device A10 is described. Note that FIGS. 11 to 20 (excluding FIGS. 14, 15 and 17) are sectional views taken along the same plane as FIG. 5.

Figure 11:
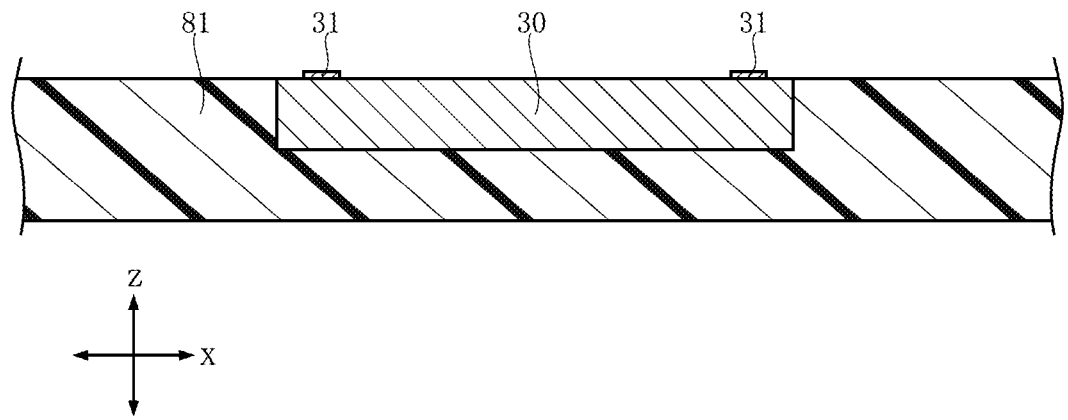
FIG. 11 is a sectional view illustrating a step of manufacturing the semiconductor device shown in FIG. 1.

First, a semiconductor element 30 is embedded in a sealing resin 81, as shown in FIG. 11. The sealing resin 81 may be made of a material containing a black epoxy resin, for example. This step includes placing the material of the sealing resin 81 with the semiconductor element 30 in a mold, followed by compression molding. In this way, the semiconductor element 30 is embedded in the sealing resin 81. This step is performed such that the electrodes 31 are exposed from the sealing resin 81.

Figure 12:
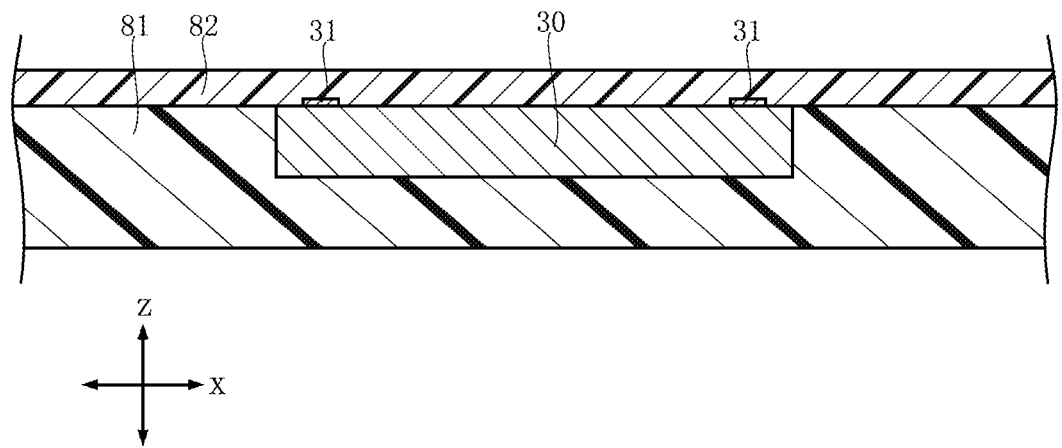
FIG. 12 is a sectional view illustrating a step of manufacturing the semiconductor device shown in FIG. 1.

Next, as shown in FIG. 12, an insulating layer 82 is stacked on the sealing resin 81 to cover the electrodes 31 of the semiconductor element 30. The insulating layer 82 is made of a material containing a thermosetting synthetic resin and an additive that contains a metallic element for forming a portion of wiring layers 83 (detailed later). The synthetic resin may be an epoxy resin or polyimide. The insulating layer 82 is formed by compression molding.

Next, as shown in FIGS. 13 to 17, a plurality of wiring layers 83 are formed to connect to the electrodes 31 of the semiconductor element 30. The wiring layers 83 correspond to the first wiring layers 21 of the semiconductor device A10. Each wiring layer 83 thus includes a first connecting part 211 and a first main part 212. The step of forming each wiring layer 83 includes depositing a base layer 83A on the insulating layer 82 and forming a plating layer 83B that covers the base layer 83A.

Figure 13:
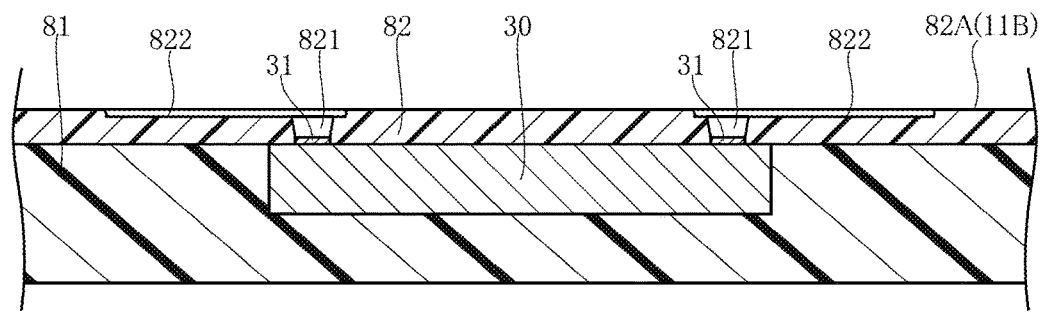
FIG. 13 is a sectional view illustrating a step of manufacturing the semiconductor device shown in FIG. 1.
Figure 14:
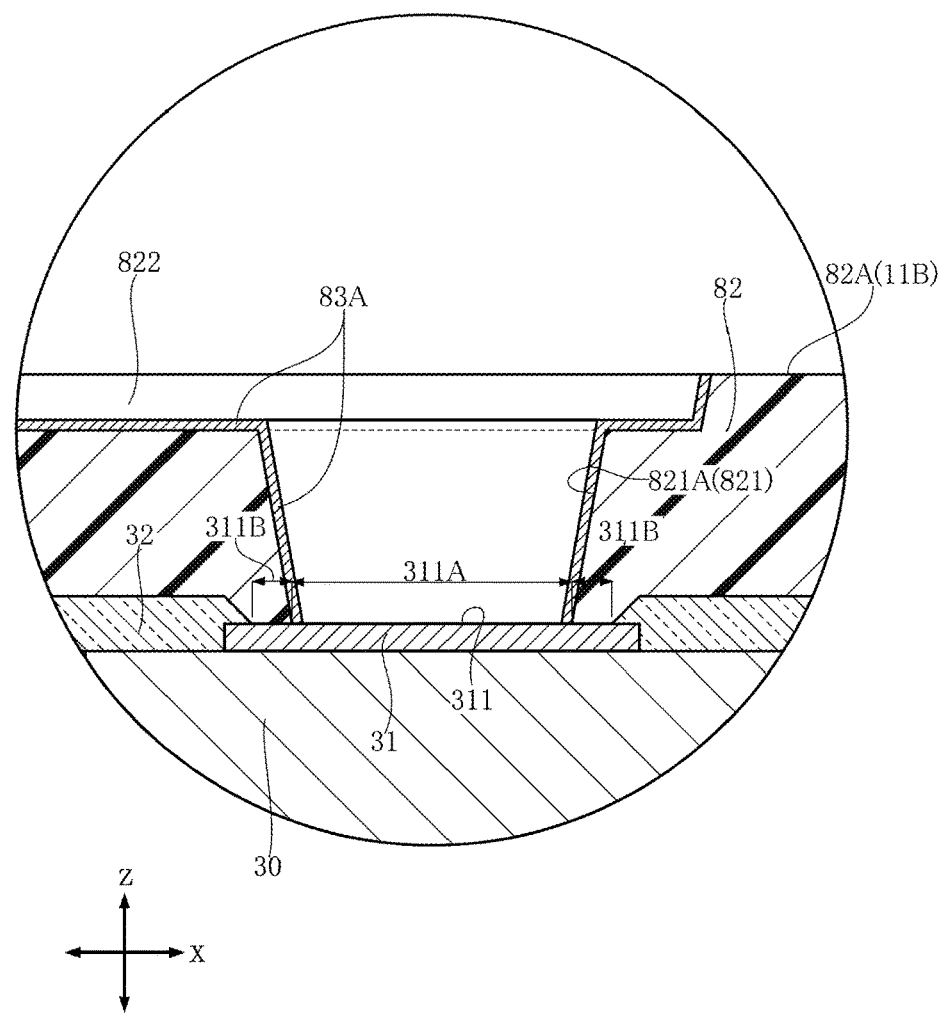
FIG. 14 is an enlarged fragmentary view of FIG. 13.
Figure 15:
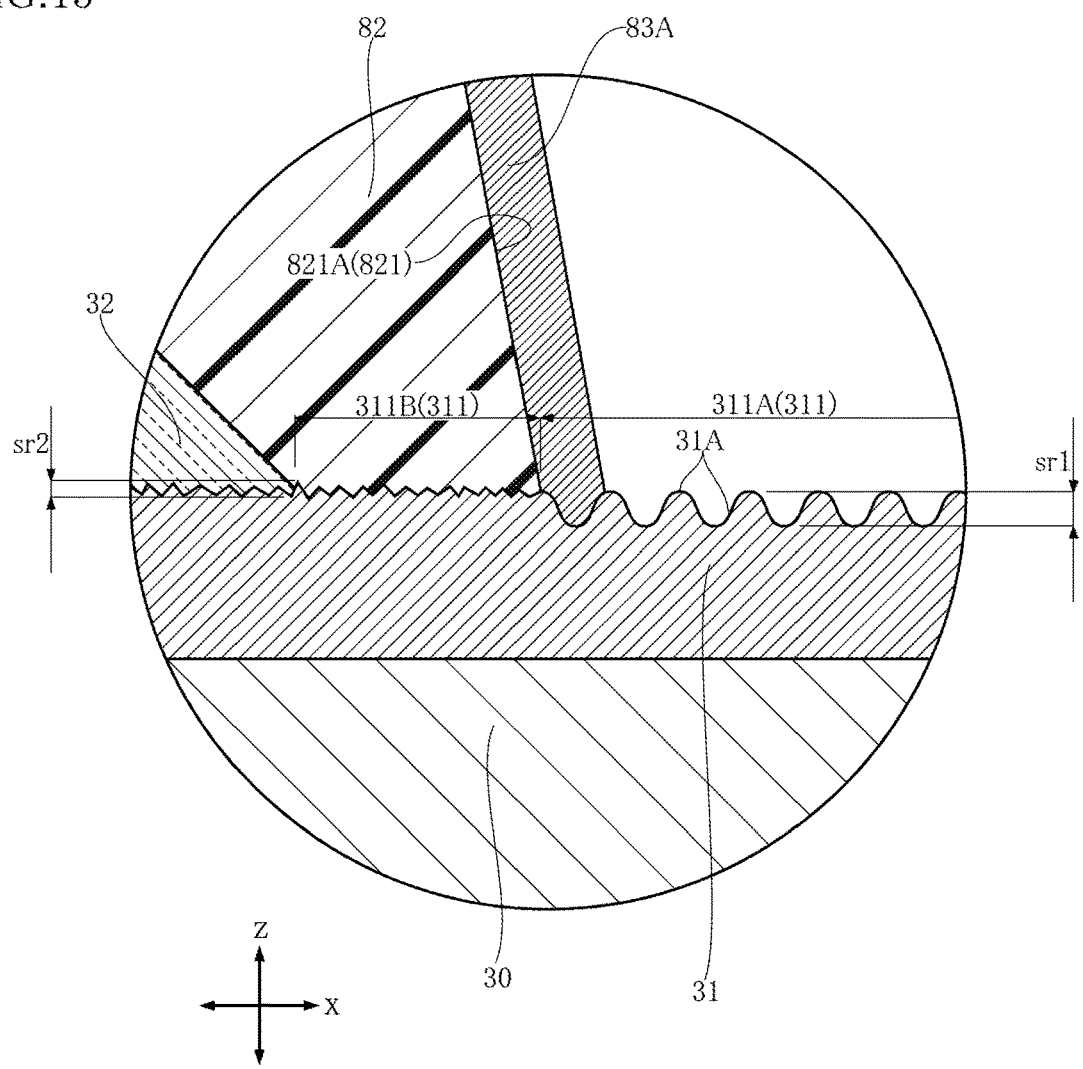
FIG. 15 is an enlarged fragmentary view of FIG. 14.

First, as shown in FIG. 14, the base layer 83A is deposited on the insulating layer 82. The base layer 83A is formed from the metallic element contained in the additive that is used in the insulating layer 82. This step includes forming a plurality of penetrated parts 821 and a plurality of grooves 822 in the insulating layer 82 as shown in FIG. 13. Each penetrated part 821 penetrates the insulating layer 82 in the thickness direction z. The penetrated part 821 is formed to expose a portion of the surface (the connecting surface 311) of one of the electrodes 31 of the semiconductor element 30. Each groove 822 is recessed from the surface 82A of the insulating layer 82 and connected to a relevant penetrated part 821. The surface 82A corresponds to the first reverse surface 11B of the first insulating layer 11. The penetrated parts 821 and the grooves 822 are formed by irradiating the insulating layer 82 with a laser beam based on the positions of the electrodes 31 identified by image recognition using an infrared camera. During the laser irradiation, the incident position of the laser beam on the insulating layer 82 is corrected as necessary based on the position information of the electrodes 31 obtained by image recognition. The laser is an ultraviolet laser that emits a beam having a wavelength of 355 nm and a beam diameter of 17 μm. As shown in FIG. 15, when each penetrated part 821 is formed, the laser beam is used to form asperities 31A on the portion of the surface (the first region 311A of the connecting surface 311) of a relevant electrode 31 exposed from the insulating layer 82 through the penetrated part 821. Irradiating the insulating layer 82 with the laser beam excites the metallic element contained in the additive used in the insulating layer 82. As a result, a base layer 83A forms on the insulating layer 82 so as to cover the inner peripheral surface 821A of each penetrated part 821 and each groove 822.

Figure 16:
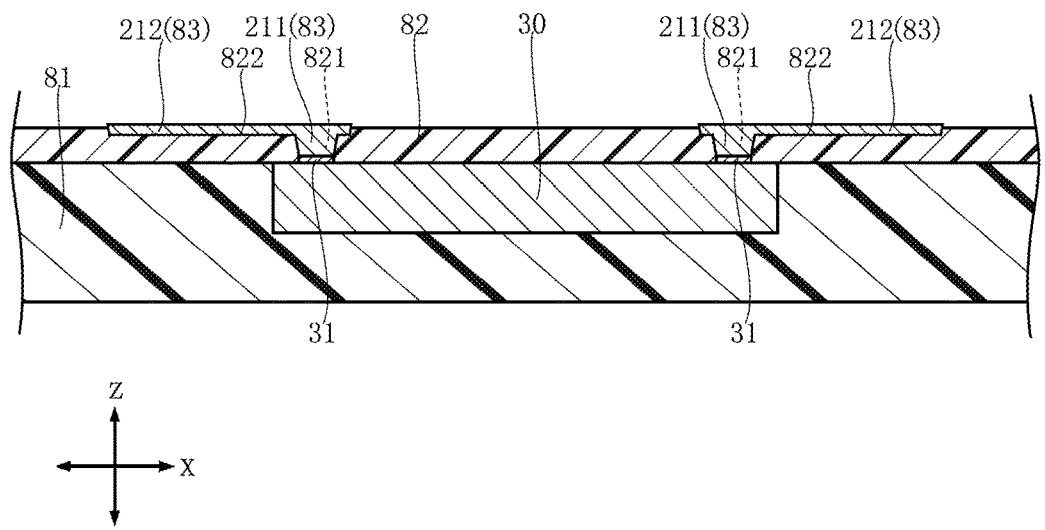
FIG. 16 is a sectional view illustrating a step of manufacturing the semiconductor device shown in FIG. 1.
Figure 17:
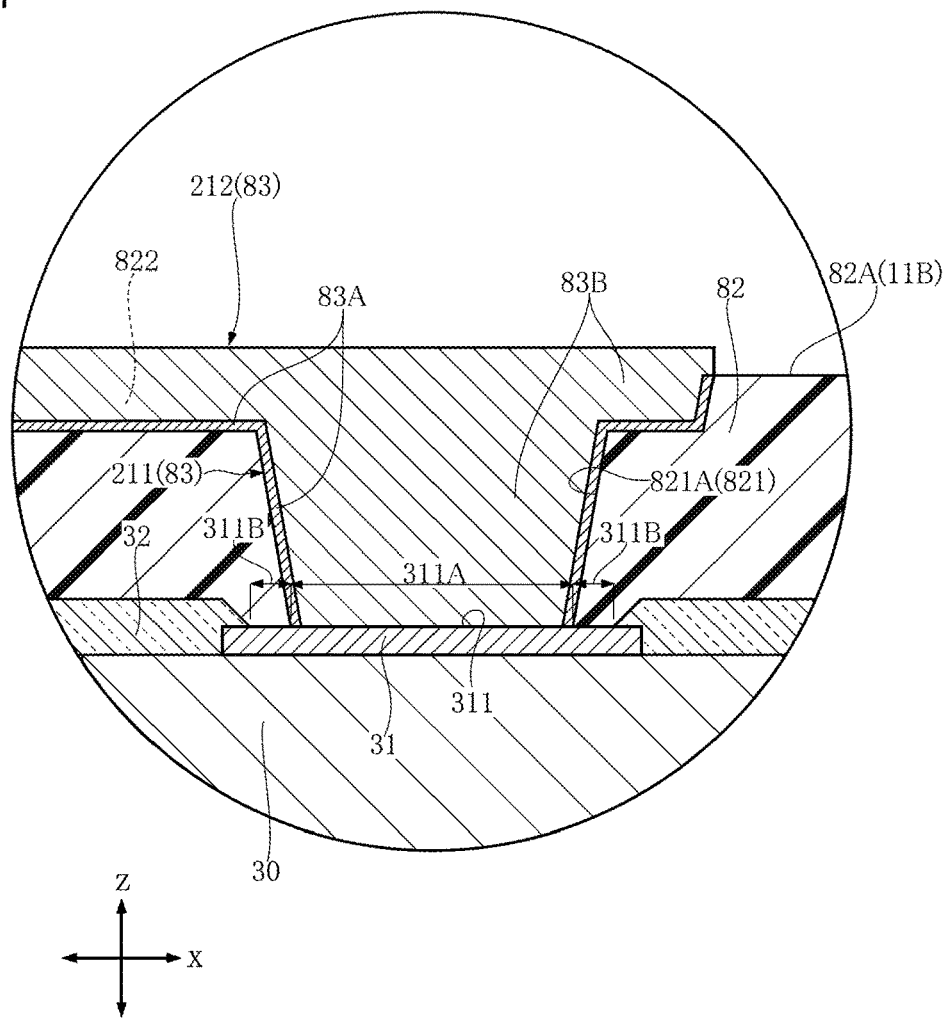
FIG. 17 is an enlarged fragmentary view of FIG. 16.

Next, as shown in FIG. 17, a plating layer 83B covering each base layer 83A is formed. The plating layer 83B is made of a material containing copper. The plating layer 83B is formed by electroplating, electroless plating or a combined use of the both. In this way, as shown in FIG. 16, the first connecting part 211 of each wiring layer 83 is formed in a penetrated part 821. Also, the first main part 212 of each wiring layer 83 is formed in a groove 822. These parts together form a plurality of wiring layers 83.

Figure 18:
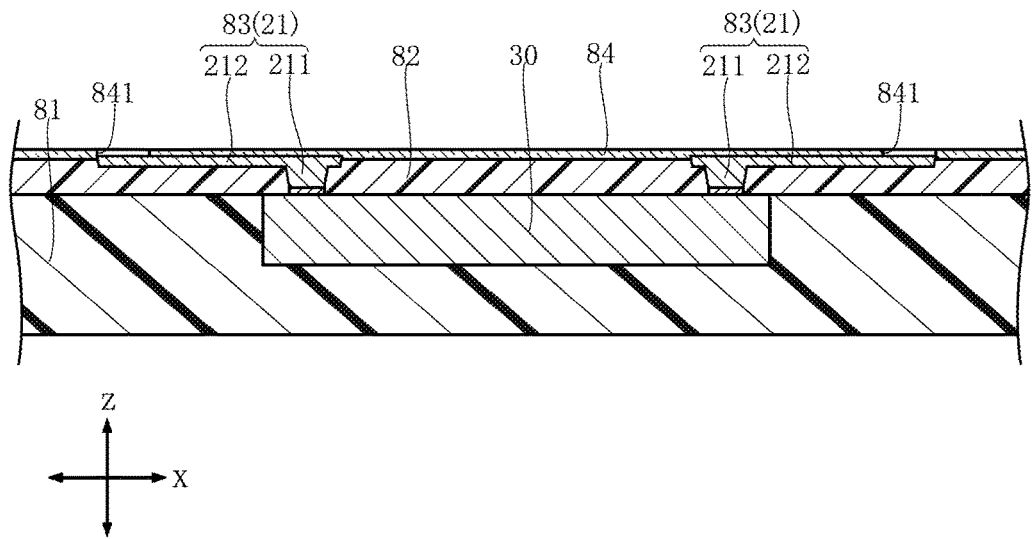
FIG. 18 is a sectional view illustrating a step of manufacturing the semiconductor device shown in FIG. 1.

Next, as shown in FIG. 18, a protective layer 84 is stacked on the insulating layer 82 to cover the first main parts 212 of the wiring layers 83. The protective layer 84 has a plurality of openings 841 penetrating in the thickness direction z. First, photosensitive polyimide is applied to the surfaces of the insulating layer 82 and the wiring layers 83 using a spin coater. Then, the photosensitive polyimide is patterned by photolithography to form a plurality of openings 841. Through the openings 841, a portion of the first main part 212 of each wiring layer 83 is exposed from the protective layer 84.

Figure 19:
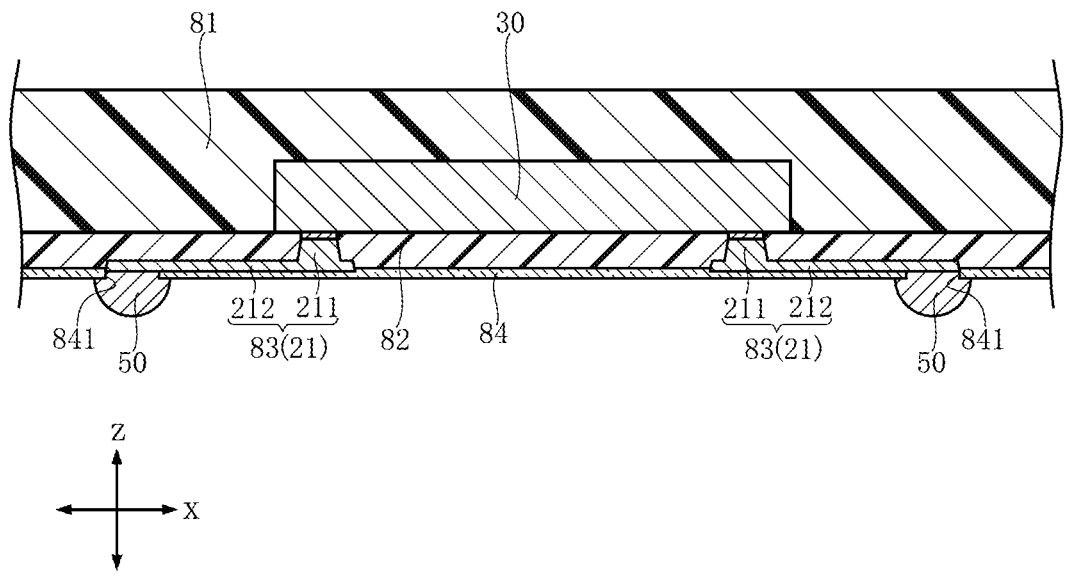
FIG. 19 is a sectional view illustrating a step of manufacturing the semiconductor device shown in FIG. 1.

Next, as shown in FIG. 19, a plurality of terminals 50 are formed such that each terminal 50 is bonded to a wiring layer 83 at the exposed portion of the first main part 212 through an opening 841 of the protective layer 84. First, a base 51 of each terminal 50 is formed as shown in FIG. 8. The base 51B is formed by electroless plating. Then, a bump 52 of each terminal 50 is formed as shown in FIG. 8. The bump 52 is formed by reflowing a conductive material such as lead-free solder containing tin, followed by cooling the molten material until it solidifies. The terminals 50 are formed in this way.

Figure 20:
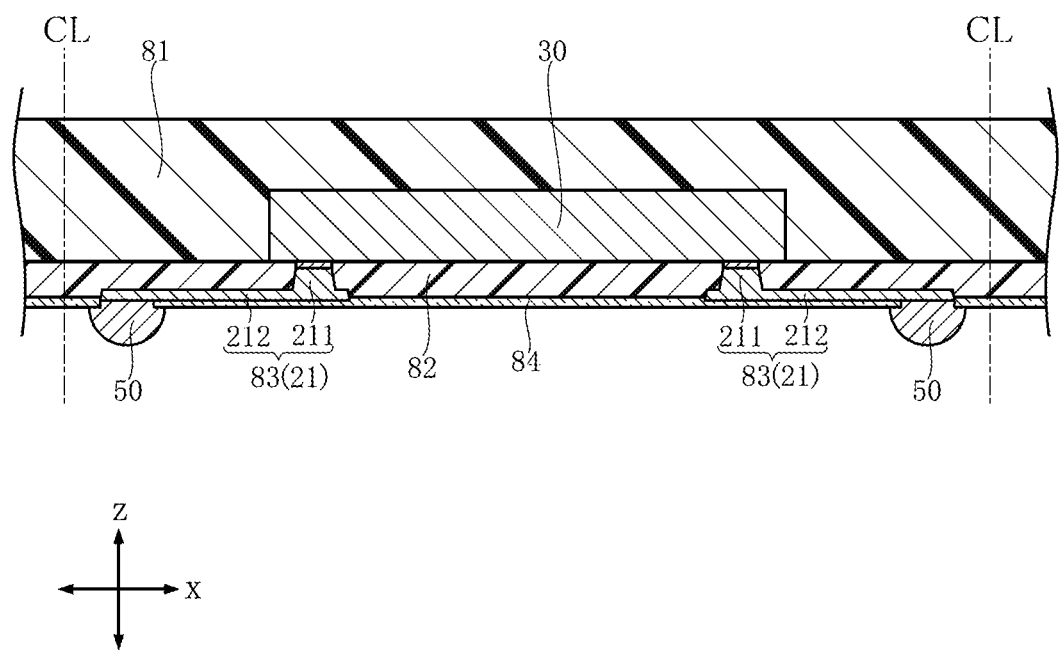
FIG. 20 is a sectional view illustrating a step of manufacturing the semiconductor device shown in FIG. 1.

Finally, as shown in FIG. 20, the sealing resin 81, the insulating layer 82 and the protective layer 84 are cut along the cutting lines CL into separate pieces by using, for example, a dicing blade. Each piece is cut to contain one semiconductor element 30 and a plurality of wiring layers 83 connected thereto. The sealing resin 81, the insulating layer 82 and the protective layer 84 included in a single piece separated in this step respectively correspond to the sealing resin 41, the first insulating layer 11 and the protective layer 42 of the semiconductor device A10. Through the steps described above, the semiconductor device A10 is obtained.

The following describes advantages of the semiconductor device A10.

The semiconductor device A10 includes the first wiring layers 21 each having a first connecting part 211 that is contained in a first penetrated part 111 of the first insulating layer 11 and that is connected to an electrode 31 of the semiconductor element 30. Each electrode 31 has a connecting surface 311 including a first region 311A and a second region 311B. The first region 311A is exposed from the first insulating layer 11 through the first penetrated part 111. The second region 311B is covered with the first insulating layer 11. The first connecting part 211 is in contact with the first region 311A. As shown in FIG. 10, the surface roughness sr1 of the first region 311A is greater than the surface roughness sr2 of the second region 311B. This means that the first region 311A has a larger surface area per unit area than the second region 311B. This serves to increase the contact area of the first region 311A with the first connecting part 211. This also serves produce the anchoring effect between the first region 311A and the first connecting part 211. The semiconductor device A10 can therefore improve the adhesion of the wiring layers (the first wiring layers 21) to the electrodes 31 of the semiconductor element 30.

The method for manufacturing the semiconductor device A10 includes the step of forming the wiring layers 83, and this step includes depositing the base layers 83A on the insulating layer 82. This step involves forming the penetrated parts 821 by irradiation with a laser beam. Through each penetrated part 821, a portion of the surface (the connecting surface 311) of each electrode 31 of the semiconductor element 30 is exposed from the insulating layer 82. This ensures that each base layer 83A is deposited to cover the inner peripheral surface 821A defining a penetrated part 821 of the insulating layer 82. At this time, the laser beam is used to form the asperities 31A on the portion of the surface of each electrode 31 exposed from the insulating layer 82 through each penetrated part 821 as shown in FIG. 15. As a result, the surface, more specifically the connecting surface 311 of each electrode 31 is formed with a first region 311A and a second region 311B.

The penetrated parts 821 are formed in the insulating layer 82 by irradiating the insulating layer 82 with a laser beam based on the positions of the electrodes 31 identified by image recognition. This ensures that the surface (the connecting surface 311) of each electrode 31 is divided into the first region 311A and the second region 311B at a precise boundary location.

The method for manufacturing the semiconductor device A10 includes the step of depositing the base layers 83A on the insulating layer 82, ensuring that the first inner peripheral surface 111A of each first penetrated part 111 in the first insulating layer 11 is covered with a first base layer 21A. The first inner peripheral surface 111A is inclined relative to the first obverse surface 11A of the first insulating layer 11. In addition, each first penetrated part 111 has a cross-sectional area transverse to the thickness direction z that gradually increases from the side closer to the first obverse surface 11A toward the side closer to the first reverse surface 11B. This profile results from that each penetrated part 821 is formed in the insulating layer 82 by directing a laser beam from the surface 82A of the insulating layer 82 toward the surface (the connecting surface 311) of a relevant electrode 31.

The step of depositing the base layers 83A on the insulating layer 82 includes forming the grooves 822 by the laser irradiation in addition to the penetrated parts 821. Each groove 822 thus formed is recessed from the surface 82A of the insulating layer 82 and connected to a relevant penetrated part 821. This ensures that the base layers 83A are deposited to cover the grooves 822. That is, the wiring layers 83 can be patterned as desired by means of laser irradiation.

The method for manufacturing the semiconductor device A10 includes the step of forming the wiring layers 83 that includes the step of forming a base layer 83A to cover each plating layer 83B. In this step, the plating layer 83B is formed by electroplating, electroless plating or a combined use of the both. Unlike electroplating, electroless plating can form the plating layers 83B without forming a conduction path on the surface 82A of the insulating layer 82. The wiring layers 83 can therefore be formed efficiently.

The semiconductor device A10 includes the protective layer 42 and the terminals 50. The protective layer 42 covers the first reverse surface 11B of the first insulating layer 11 and the first main part 212 of each first wiring layer 21. The protective layer 42 has the openings 421 through which a portion of each first main part 212 is exposed from the protective layer 42. Each terminal 50 is bonded to the portion of the first main part 212 exposed from the protective layer 42 through the opening 421 and protrudes from the protective layer 42. When the semiconductor device A10 is mounted on a wiring board, this configuration facilitates the accurate poisoning of the semiconductor device A10 on the wiring board.

In addition, the terminals 50 are made of a material containing tin, so that at least a portion of each terminal 50 will melt by reflowing when the semiconductor device A10 is bonded to the wiring board. Consequently, the effect by which a positional misalignment of the semiconductor device A10 to the wiring board is automatically corrected (the self-alignment effect) can be achieved.

With reference to FIGS. 21 to 28, a semiconductor device A20 according to a second embodiment is described below. In these figures, the components that are the same as or similar to those of the semiconductor device A10 are denoted by the same reference signs, and the descriptions thereof are omitted.

Figure 21:
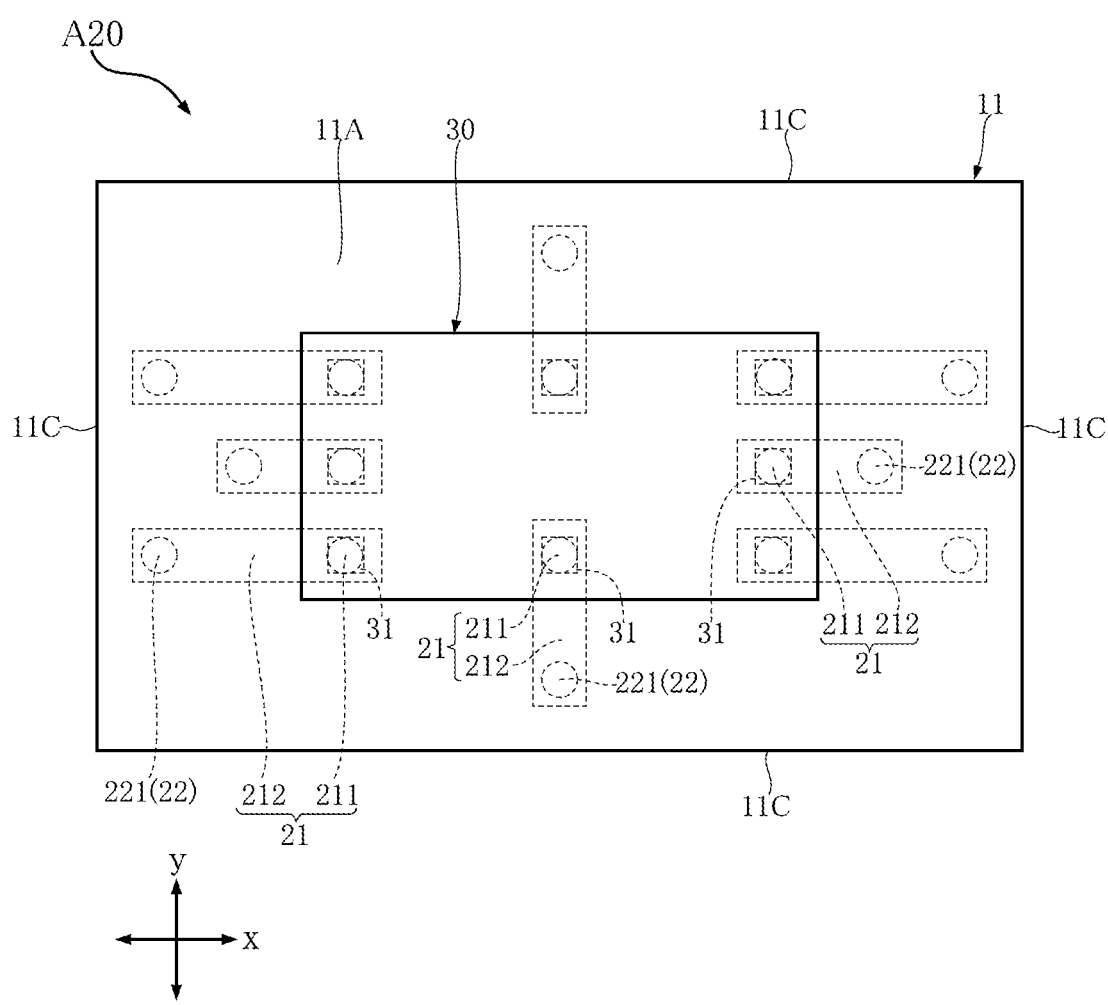
FIG. 21 is a plan view of a semiconductor device according to a second embodiment, as seen through a sealing resin.
Figure 22:
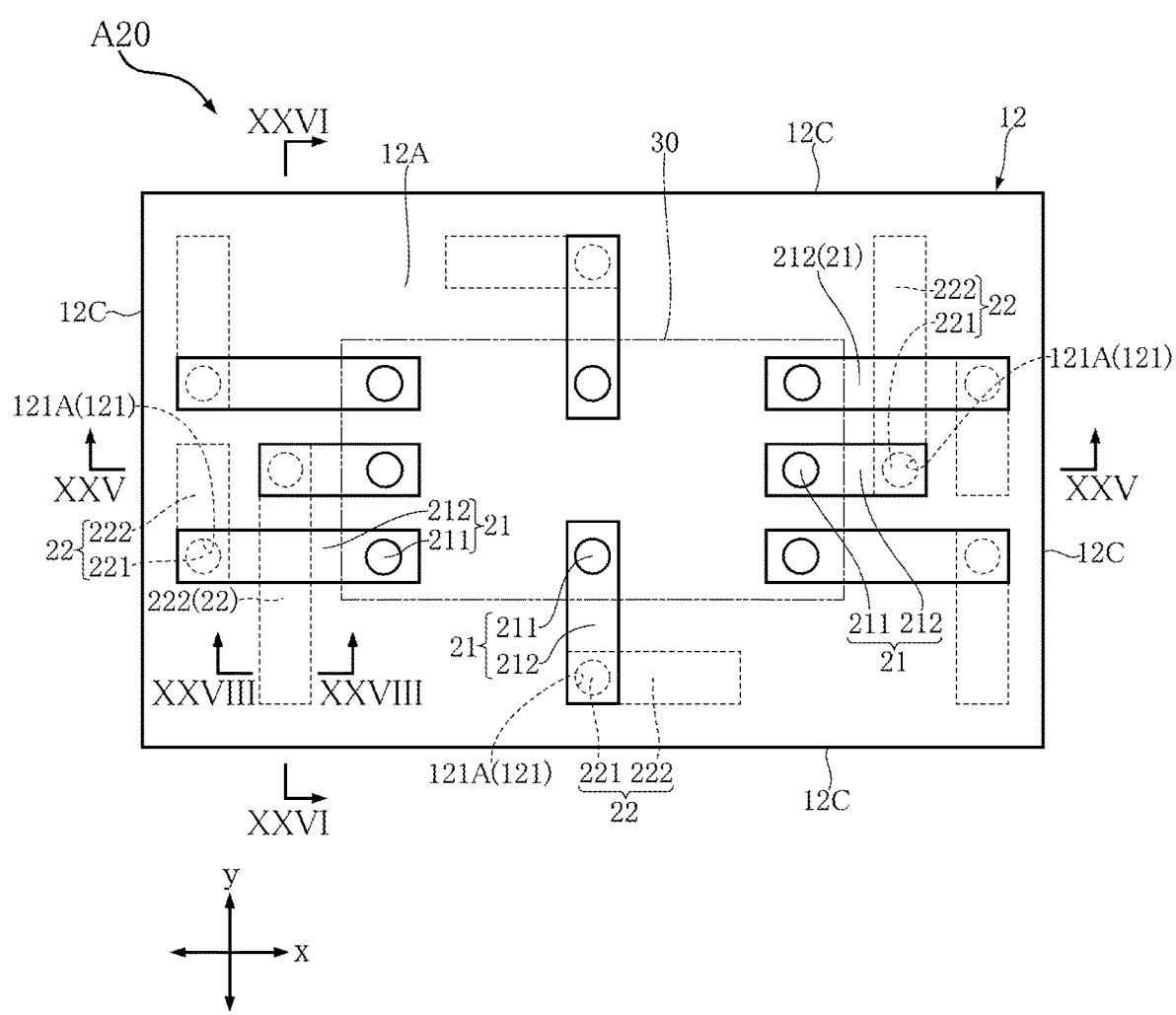
FIG. 22 is a plan view corresponding to FIG. 21, as seen further through a first insulating layer and a semiconductor element.
Figure 24:
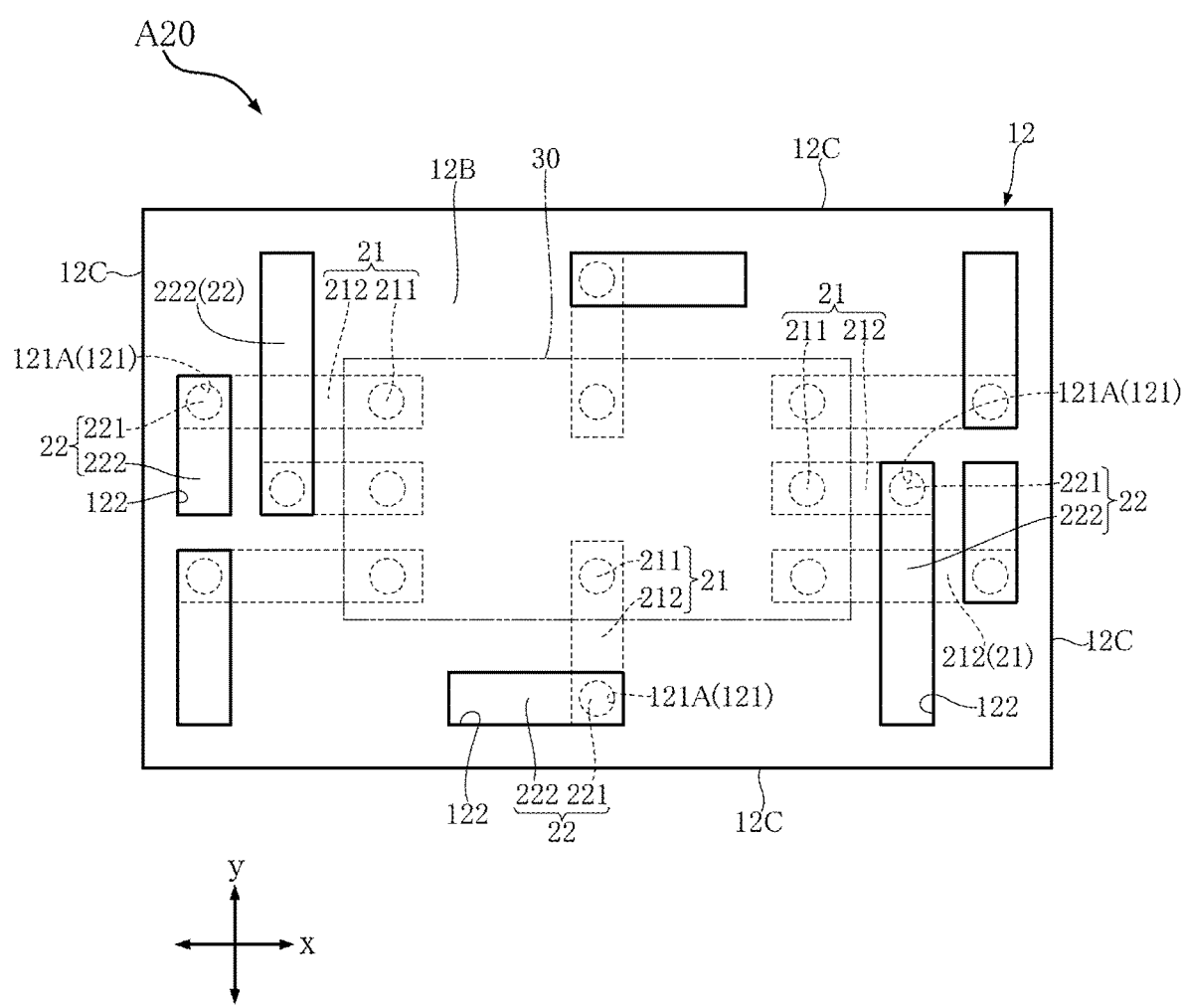
FIG. 24 is a bottom view corresponding to FIG. 23, as seen through a protective layer and a plurality of terminals.

The semiconductor device A20 differs from the semiconductor device A10 in that it further includes a second insulating layer 12 and a plurality of second wiring layers 22. In addition, the configurations of the protective layer 42 and the terminals 50 are different. For convenience of understanding, FIG. 21 shows the sealing resin 41 as transparent, FIG. 22 is a view similar to FIG. 21 but shows the first insulating layer 11 and the semiconductor element 30 also as transparent. FIG. 24 shows the protective layer 42 and the terminals 50 as transparent. In FIG. 24, the outline of the semiconductor element 30 is shown in phantom lines.

Figure 25:
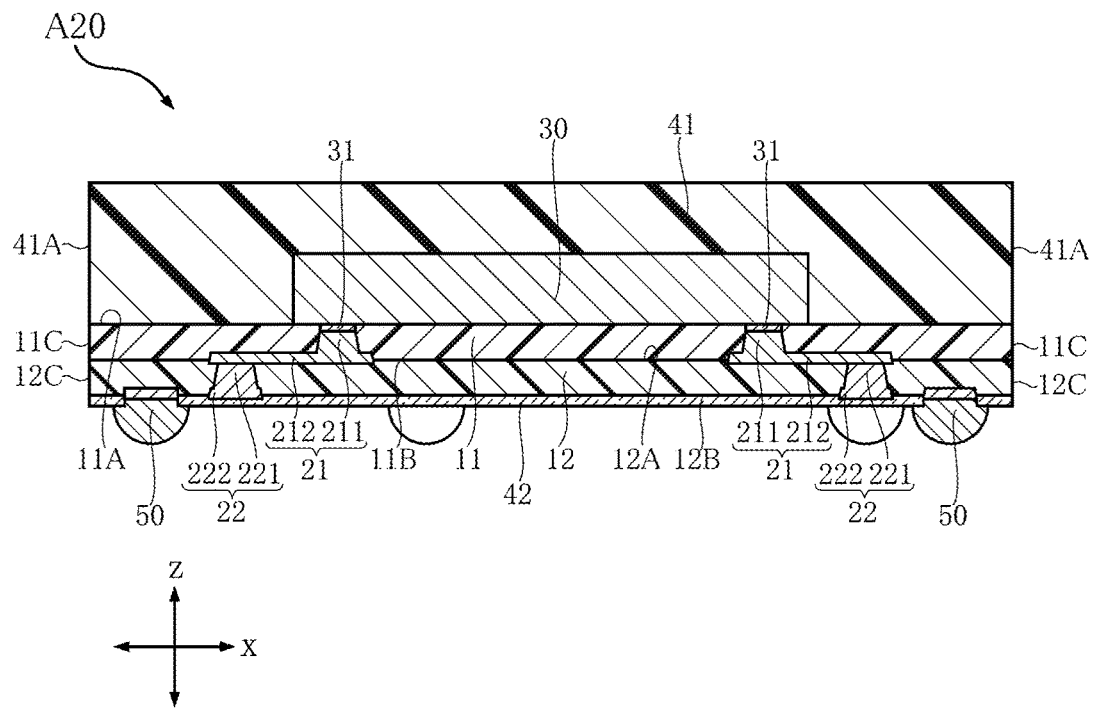
FIG. 25 is a sectional view taken along line XXV-XXV of FIG. 22.
Figure 26:
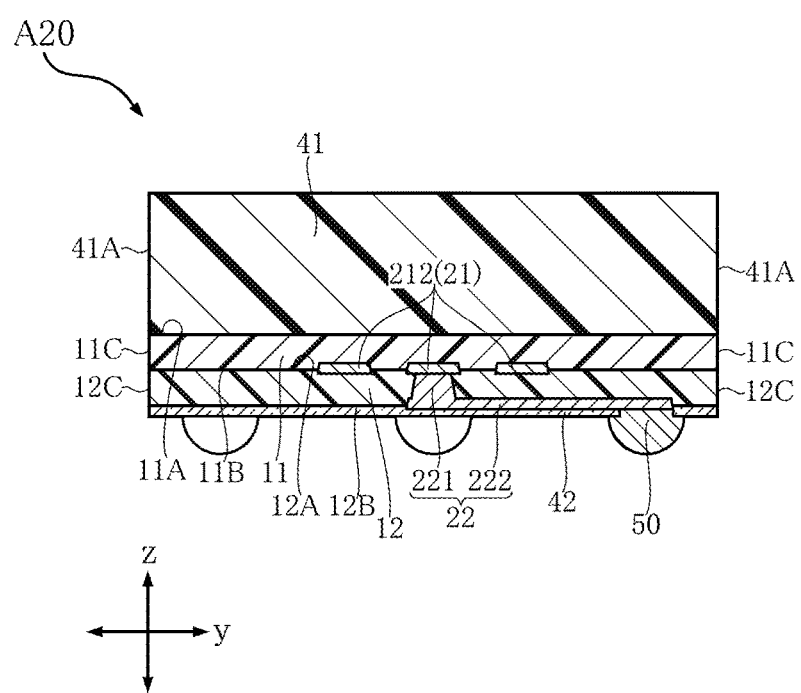
FIG. 26 is a sectional view taken along line XXVI-XXVI of FIG. 22.

As shown in FIGS. 25 and 26, the second insulating layer 12 is disposed in contact with the first reverse surface 11B of the first insulating layer 11. The first insulating layer 11 is sandwiched between the second insulating layer 12 and the sealing resin 41 in the thickness direction z. The second insulating layer 12 is made of a material containing a thermosetting synthetic resin and an additive that contains a metallic element forming a portion (a second base layer 22A described later) of each second wiring layer 22. The synthetic resin may be an epoxy resin or polyimide, for example. The second insulating layer 12 includes a second obverse surface 12A, a second reverse surface 12B and a plurality of end surfaces 12C. The second obverse surface 12A and the second reverse surface 12B face away from each other in the thickness direction z. The second obverse surface 12A is in contact with the first reverse surface 11B. The end surfaces 12C are connected to the second obverse surface 12A and the second reverse surface 12B. Each side surface 12C faces either in the first direction x or the second direction y. Each end surface 12C is flush with one end surface 11C of the first insulating layer 11 and one end surface 41A of the sealing resin 41.

Figure 27:
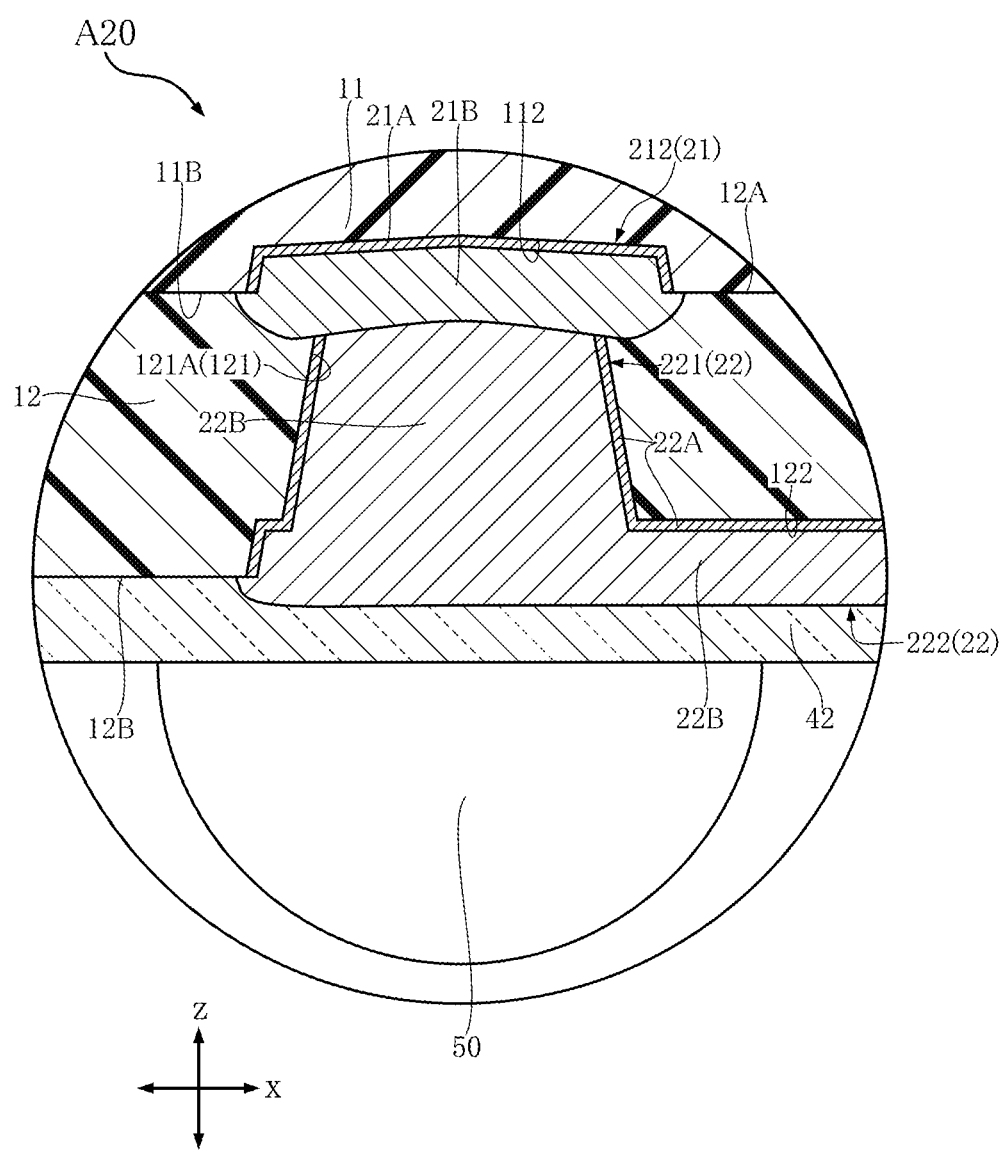
FIG. 27 is an enlarged fragmentary view of FIG. 26.

As shown in FIGS. 22, 24 and 27, the second insulating layer 12 includes a plurality of second penetrated parts 121. Each second penetrated part 121 extends in the thickness direction z from the second obverse surface 12A to the second reverse surface 12B, penetrating the second insulating layer 12 in the thickness direction z. Each second penetrated part 121 is defined by a second inner peripheral surface 121A of the second insulating layer 12. Each second inner peripheral surface 121A is inclined relative to the second obverse surface 12A. Each second inner peripheral surface 121A is inclined inwardly of the relevant second penetrated part 121 as proceeding from a position closer to the second reverse surface 12B to a position closer to the second obverse surface 12A. Accordingly, each second penetrated part 121 has a cross-sectional area transverse to the thickness direction z that gradually increases as proceeding reversely, i.e., from the position closer to the second obverse surface 12A toward the position closer to the second reverse surface 12B.

Figure 28:
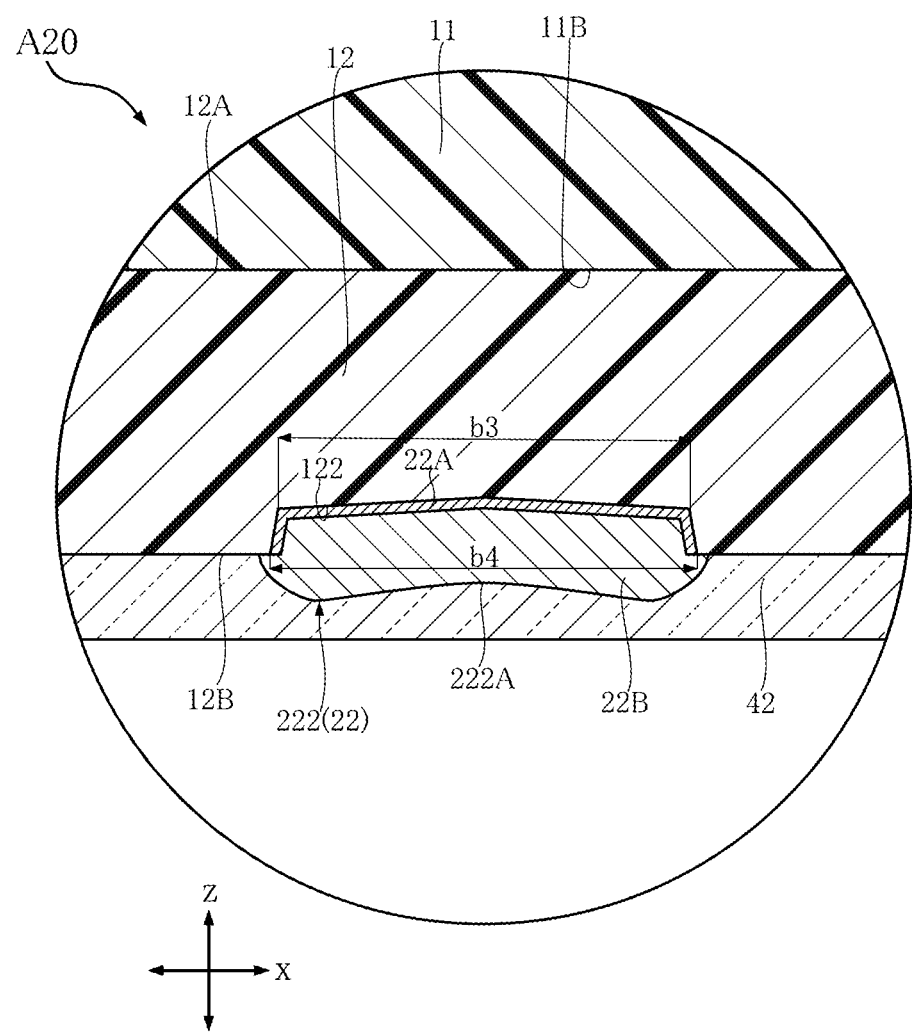
FIG. 28 is an enlarged fragmentary sectional view taken along line XXVIII-XXVIII of FIG. 22.

As shown in FIGS. 27 and 28, the second insulating layer 12 includes a plurality of second grooves 122. The second grooves 122 are recessed in the thickness direction z from the second reverse surface 12B. Each second groove 122 is connected to one of the second penetrated parts 121. As shown in FIG. 24, each second groove 122 extends in a direction perpendicular to the thickness direction z. As shown in FIG. 28, each second groove 122 has a pair of side surfaces inclined relative to the second reverse surface 12B. Each second groove 122 has a width b3 that is measured between the pair of side surfaces at the boundary with the bottom of the second groove 122 and another width b4 that is measured between the pair of side surfaces at the boundary with the second reverse surface 12B, where the width b3 is smaller than the width b4.

As shown in FIGS. 25 and 26, the second wiring layers 22 are disposed on the second insulating layer 12. The second wiring layers 22 and the first wiring layers 21 together form a part of a conduction path between a wiring board and the semiconductor element 30 when the semiconductor device A20 is mounted on the wiring board. Each second wiring layer 22 includes a second connecting part 221 and a second main part 222. As shown in FIGS. 22, 24 and 27, the second connecting part 221 is arranged in one of the second penetrated parts 121 of the second insulating layer 12. The second connecting part 221 is in contact with the second inner peripheral surface 121A of the second penetrated part 121. The second connecting part 221 is connected to the first main part 212 of one of the first wiring layers 21. As shown in FIGS. 24 to 26, the second main part 222 of each second wiring layer 22 is connected to the second connecting part 221 of the second wiring layer 22 and located on the side closer to the second reverse surface 12B of the second insulating layer 12. More specifically, the second main part 222 is located in one of the second grooves 122 of the second insulating layer 12. The second main part 222 is in contact with a relevant second groove 122. As shown in FIGS. 27 and 28, in the semiconductor device A20, the second main part 222 of each second wiring layer 22 has a portion bulging out of a relevant second groove 122.

As shown in FIGS. 22 and 24, at least a portion of each second penetrated part 121 of the second insulating layer 12 overlaps with the first main part 212 of a relevant first wiring layer 21 as viewed in the thickness direction z. As shown in FIG. 24, the second main part 222 of each second wiring layer 22 includes a portion overlapping with the first main part 212 of a relevant first wiring layer 21 as viewed in the thickness direction and extends in a direction different from the direction in which the first main part 212 extends.

As shown in FIG. 27, the second connecting part 221 and the second main part 222 of each second wiring layer 221 includes a second base layer 22A and a second plating layer 22B. The second base layer 22A is formed from a metallic element that is contained in the additive used in the second insulating layer 12. The second base layer 22A is in contact with the second insulating layer 12. The second base layer 22A that forms the second connecting part 221 of each second wiring layer 22 covers one of the second inner peripheral surfaces 121A of the second insulating layer 12. The second plating layer 22B covers the second base layer 22A of the second wiring layer 22. The second plating layer 22B may be made of a material containing tin, for example. In the second connecting part 221 of each second wiring layer 22, the second plating layer 22B is in contact with the first main part 212 of a relevant first wiring layer 21. As shown in FIG. 28, each second wiring layer 22 has a recess 222A that is recessed in the thickness direction z in the second plating layer 22B forming the second main part 222.

The recess 222A extends in the direction in which a relevant second groove 122 of the second insulating layer 12 extends.

Figure 23:
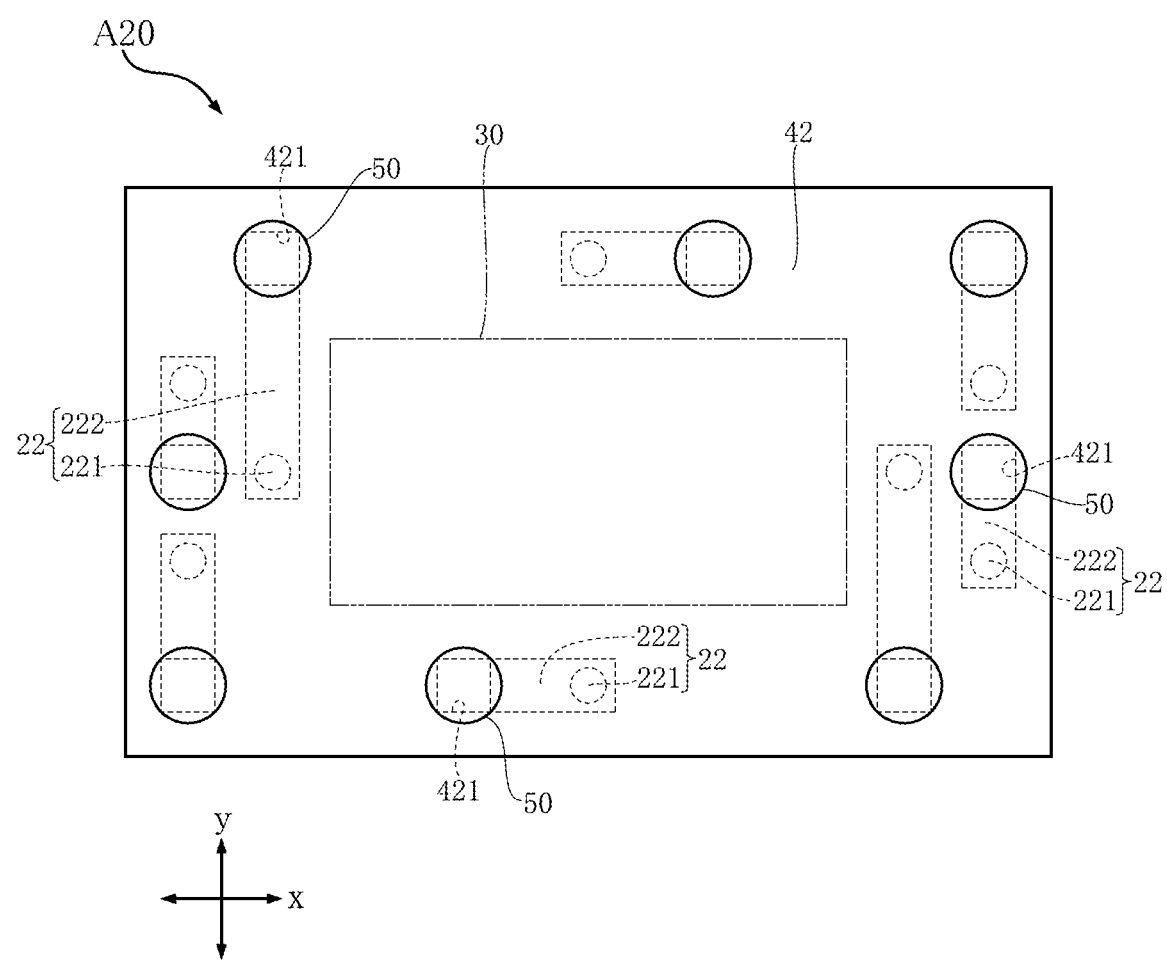
FIG. 23 is a bottom view of the semiconductor device shown in FIG. 21.

As shown in FIGS. 25 and 26, the protective layer 42 covers the second reverse surface 12B of the second insulating layer 12 and the second main part 222 of each second wiring layer 22. When the semiconductor device A20 is mounted on a wiring board, the protective layer 42 faces the wiring board. The second main part 222 of each second wiring layer 22 has a portion exposed from the protective layer 42 through a relevant opening 421. As shown in FIG. 23, each terminal 50 is bonded to the second wiring layer 22 at the portion of the second main part 222 exposed through the opening 421.

The following describes advantages of the semiconductor device A20.

The semiconductor device A20 includes the first wiring layers 21 each having a first connecting part 211 that is contained in a first penetrated part 111 of the first insulating layer 11 and that is connected to an electrode 31 of the semiconductor element 30. Each electrode 31 has a connecting surface 311 including a first region 311A and a second region 311B. The first region 311A is exposed from the first insulating layer 11 through the first penetrated part 111. The second region 311B is covered with the first insulating layer 11. The first connecting part 211 is in contact with the first region 311A. As shown in FIG. 10, the surface roughness sr1 of the first region 311A is greater than the surface roughness sr2 of the second region 311B. The semiconductor device A20 can therefore improve the adhesion of the wiring layers (the first wiring layers 21) to the electrodes 31 of the semiconductor element 30.

The semiconductor device A20 further includes the second insulating layer 12 having the second obverse surface 12A, the second reverse surface 12B and the second penetrated parts 121, and the second wiring layers 22 each having a second connecting part 221 and a second main part 222. The second obverse surface 12A is in contact with the first reverse surface 11B of the first insulating layer 11. The second connecting part 221 is contained in the second penetrated part 121 and connected to the first main part 212 of a relevant first wiring layer 21. The second main part 222 is in contact with the second connecting part 221 and is located on the side closer to the second reverse surface 12B of the second insulating layer 12. The first main part 212 is covered with the second insulating layer 12. At least a portion of the second penetrated part 121 overlaps with the first main part 212 as viewed in the thickness direction z. In this way, each first wiring layer 21 and each second wiring layers 22 of the semiconductor device A20 can be arranged such that the second main part 222 overlaps with the first main part 212 as viewed in the thickness direction z, without a short circuit in the respective conduction paths. The semiconductor device A20 can be configured to define more complex conduction paths than the semiconductor device A10.

The present disclosure is not limited to the foregoing embodiments. The specific configuration of each part of the semiconductor devices may be varied in design in many ways. For example, each embodiment may be modified to include a plurality of semiconductor elements 30. The types of the semiconductor elements 30 can be selected depending on the desired applications and functions. In addition, although the foregoing embodiments employ various components having a rectangular outer shape as viewed in the thickness direction z, the present disclosure is not limited to such. The outer shape of such a component may alternatively be circular or hexagonal.

REFERENCE NUMERALS

A10, A20: Semiconductor device 11: First insulating layer
11A: First obverse surface 11B: First reverse surface
11C: End surface 111: First penetrated part
111A: First inner peripheral surface 112: First groove
12: Second insulating layer 12A: Second obverse surface
12B: Second reverse surface 12C: End surface
121: Second penetrated part
121A: Second inner peripheral surface
122: Second groove 21: First wiring layer
21A: First base layer 21B: First plating layer
211: First connecting part 212: First main part
212A: Recess 22: Second wiring layer
22A: Second base layer 22B: Second plating layer
221: Second connecting part 222: Second main part
222A: Recess 30: Semiconductor element
31: Electrode 311: Connecting surface
311A: First region 311B: Second region
32: Passivation film 41: Sealing resin
41A: Side surface 42: Protective layer
421: Opening 50: Terminal
51: Base 52: Bump
81: Sealing resin 82: Insulating layer
82A: Surface 821: Penetrated part
821A: Inner peripheral surface 822: Groove
83: Wiring layer 83A: Base layer
83B: Plating layer 84: Protective layer
841: Opening b1, b2, b3, b4: Width
z: Thickness direction x: First direction y: Second direction

The invention claimed is:

1. A semiconductor device comprising:
a first insulating layer including a first obverse surface and a first reverse surface spaced apart from each other in a thickness direction, the first insulating layer being formed with a first penetrated part extending in the thickness direction;
a semiconductor element that includes an electrode corresponding to the first penetrated part and is in contact with the first obverse surface;
a first wiring layer including a first connecting part and a first main part, the first connecting part being arranged in the first penetrated part and in contact with the electrode, the first main part being connected to the first connecting part and disposed on the first reverse surface; and
a sealing resin in contact with the first obverse surface and covering the semiconductor element,
wherein the electrode has a connecting surface facing the first connecting part,
the connecting surface includes a first region that is exposed from the first insulating layer through the first penetrated part and a second region that is in contact with the first insulating layer, and
the first region has a greater surface roughness than the second region.

2. The semiconductor device according to claim 1, wherein the first wiring layer includes a first base layer in contact with the first insulating layer and a first plating layer covering the first base layer, and
the first plating layer is in contact with the first region.

3. The semiconductor device according to claim 2, wherein the first insulating layer is made of a material containing a thermosetting synthetic resin and an additive that contains a metallic element forming the first base layer.

4. The semiconductor device according to claim 2 or 3, wherein the first insulating layer includes a groove recessed from the first reverse surface and connected to the first penetrated part, and
the first main part is disposed in the groove.

5. The semiconductor device according to claim 4, wherein the first main part includes a recess that is recessed in the thickness direction, and
the recess extends in a direction in which the groove extends.

6. The semiconductor device according to claim 2, wherein the first insulating layer includes a first inner peripheral surface that defines the first penetrated part, and
the first inner peripheral surface is covered with the first base layer and inclined relative to the first obverse surface.

7. The semiconductor device according to claim 6, wherein the first penetrated part has a first cross section perpendicular to the thickness direction, and an area of the first cross section increases from the first obverse surface toward the first reverse surface.

8. The semiconductor device according to claim 2, further comprising a protective layer that covers the first reverse surface and the first main part,
wherein the protective layer has an opening that penetrates in the thickness direction, and
a portion of the first main part is exposed from the protective layer through the opening.

9. The semiconductor device according to claim 8, further comprising a terminal,
wherein the terminal is bonded to the portion of the first main part exposed from the protective layer through the opening, and
the terminal protrudes from the protective layer in the thickness direction.

10. The semiconductor device according to claim 9, wherein the terminal is made of a material containing tin.

11. The semiconductor device according to claim 2, further comprising:
a second insulating layer including a second obverse surface and a second reverse surface spaced apart from each other in the thickness direction, the second insulating layer being formed with a second penetrated part extending in the thickness direction, the second obverse surface being in contact with the first reverse surface; and
a second wiring layer including a second connecting part and a second main part, the second connecting part being contained in the second penetrated part and connected to the first main part, the second main part being connected to the second connecting part and disposed on the second reverse surface,
wherein the first main part is covered with the second insulating layer, and
at least a portion of the second penetrated part overlaps with the first main part as viewed in the thickness direction.

12. The semiconductor device according to claim 11, wherein the second main part includes a portion overlapping with the first main part as viewed in the thickness direction and extends in a direction different from a direction in which the first main part extends.

13. The semiconductor device according to claim 12, wherein the second wiring layer includes a second base layer in contact with the second insulating layer and a second plating layer covering the second base layer, and
the second plating layer is in contact with the first main part in the second connecting part.

14. The semiconductor device according to claim 13, wherein the second insulating layer is made of a material containing a thermosetting synthetic resin and an additive that contains a metallic element forming the second base layer.

15. The semiconductor device according to claim 13 or 14, wherein the second insulating layer includes a second inner peripheral surface that defines the second penetrated part, and
the second inner peripheral surface is covered with the second base layer and inclined relative to the second obverse surface.

16. The semiconductor device according to claim 15, wherein the second penetrated part has a second cross section perpendicular to the thickness direction, and an area of the second cross section increases from the second obverse surface toward the second reverse surface.

17. A method for manufacturing a semiconductor device, the method comprising:
embedding a semiconductor element having an electrode in a sealing resin such that the electrode is exposed;
forming an insulating layer on the sealing resin to cover the electrode; and
forming a wiring layer including a connecting part that is embedded in the insulating layer and connected to the electrode and a main part that is connected to the connecting part,
wherein the insulating layer is made of a material containing a thermosetting synthetic resin and an additive that contains a metallic element for forming a portion of the wiring layer,
the forming the wiring layer includes: (a) forming, in the insulating layer by laser irradiation, a penetrated part to expose a portion of a surface of the electrode from the insulating layer and a groove recessed from the surface of the insulating layer and connected to the penetrated part; (b) depositing a base layer containing the metallic element to cover an inner peripheral surface defining the penetrated part of the insulating layer and the groove; and (c) forming a plating layer covering the base layer, and
the depositing the base layer includes forming, by the laser irradiation, asperities on the portion of the surface of the electrode exposed from the insulating layer through the penetrated part.

18. The method according to claim 17, wherein the forming the plating layer includes forming the plating layer by at least one of electroless plating or electrolytic plating.

* * * * *